(12) United States Patent
Ji et al.

(10) Patent No.: US 11,004,384 B2
(45) Date of Patent: May 11, 2021

(54) DISPLAY APPARATUS

(71) Applicant: LG Display Co., Ltd., Seoul (KR)

(72) Inventors: Hyelim Ji, Paju-si (KR); YongSeok Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/590,149

(22) Filed: Oct. 1, 2019

(65) Prior Publication Data
US 2020/0135089 A1    Apr. 30, 2020

(30) Foreign Application Priority Data

Oct. 31, 2018 (KR) .................. 10-2018-0132198

(51) Int. Cl.
| | | |
|---|---|---|
| *G09G 3/32* | (2016.01) | |
| *H01L 33/36* | (2010.01) | |
| *H01L 33/62* | (2010.01) | |

(52) U.S. Cl.
CPC ............... *G09G 3/32* (2013.01); *H01L 33/36* (2013.01); *H01L 33/62* (2013.01); *G09G 2310/0275* (2013.01); *G09G 2320/0219* (2013.01)

(58) Field of Classification Search
CPC ... G09G 2300/0819; G09G 2300/0861; G09G 2310/0262; G09G 2310/0275; G09G 2320/0219; G09G 3/32; G09G 3/3233; G09G 3/3291; H01L 27/156; H01L 33/36; H01L 33/62; H01L 27/3276; H01L 27/1225; H01L 51/5246; G02F 1/136213
See application file for complete search history.

(56) References Cited

U.S. PATENT DOCUMENTS

| | | | | |
|---|---|---|---|---|
| 2010/0182223 | A1* | 7/2010 | Choi | G09G 3/3233 345/76 |
| 2014/0204067 | A1* | 7/2014 | Gupta | G09G 3/3291 345/211 |
| 2015/0102299 | A1* | 4/2015 | Hong | H01L 51/5246 257/40 |
| 2016/0293883 | A1* | 10/2016 | Hong | H01L 51/5246 |
| 2016/0307988 | A1* | 10/2016 | Kim | H01L 27/1225 |
| 2016/0372497 | A1* | 12/2016 | Lee | G02F 1/136213 |
| 2017/0193900 | A1* | 7/2017 | Kwon | G09G 3/3233 |
| 2018/0261699 | A1 | 9/2018 | Yamazaki | |
| 2019/0348491 | A1* | 11/2019 | Chung | H01L 27/3276 |
| 2019/0392757 | A1* | 12/2019 | Jang | G09G 3/3233 |

FOREIGN PATENT DOCUMENTS

| | | |
|---|---|---|
| KR | 10-2017-0101203 A | 9/2017 |
| KR | 10-2017-0124636 A | 11/2017 |

* cited by examiner

*Primary Examiner* — Richard J Hong
(74) *Attorney, Agent, or Firm* — Birch, Stewart, Kolasch & Birch, LLP

(57) ABSTRACT

A display apparatus can include a first transistor disposed on a substrate, the first transistor including a first active layer made of low temperature polycrystalline silicon (LTPS); a circuit insulating layer disposed on the first transistor; a second transistor disposed on the circuit insulating layer, the second transistor including a second active layer made of an oxide semiconductor; a driving transistor disposed on the circuit insulating layer, the driving transistor having a back channel etch structure (BCE) and an active layer made of the oxide semiconductor; and a light emitting diode electrically connected to the driving transistor, in which the circuit insulating layer is disposed between the first transistor and the driving and second transistors.

19 Claims, 7 Drawing Sheets

FIG. 7

| | Gradation Region |
|---|---|
| | Subthreshold Region |

| |Vgs| | Ids [A] | | |
|---|---|---|---|
| | Tdr | Ti | Tec |
| -1 | 1.2E-12 | 2.0E-13 | -2.3E-12 |
| -0.8 | 2.0E-12 | -1.0E-13 | -1.2E-12 |
| -0.6 | 2.8E-12 | -4.4E-13 | -1.1E-12 |
| -0.4 | 4.9E-12 | 2.2E-13 | -9.6E-13 |
| -0.2 | 7.4E-12 | 3.1E-13 | -1.1E-12 |
| 0 | 1.2E-11 | -1.9E-13 | -9.6E-13 |
| 0.2 | 2.0E-11 | 6.6E-15 | -8.9E-13 |
| 0.4 | 3.8E-11 | 6.0E-14 | -9.3E-13 |
| 0.6 | 7.2E-11 | 1.7E-12 | -1.4E-12 |
| 0.8 | 1.4E-10 | 3.8E-11 | -3.2E-12 |
| 1 | 2.9E-10 | 3.6E-10 | -9.2E-12 |
| 1.2 | 5.9E-10 | 1.7E-09 | -3.1E-11 |
| 1.4 | 1.2E-09 | 5.1E-09 | -1.0E-10 |
| 1.6 | 2.2E-09 | 1.2E-08 | -3.1E-10 |
| 1.8 | 3.9E-09 | 2.2E-08 | -8.4E-10 |
| 2 | 6.0E-09 | 3.6E-08 | -2.1E-09 |
| 2.2 | 1.0E-08 | 5.4E-08 | -4.7E-09 |
| 2.4 | 1.6E-08 | 7.6E-08 | -9.6E-09 |
| 2.6 | 2.4E-08 | 1.0E-07 | -1.8E-08 |
| 2.8 | 3.5E-08 | 1.4E-07 | -3.1E-08 |
| 3 | 4.9E-08 | 1.7E-07 | -5.0E-08 |
| 3.2 | 6.4E-08 | 2.1E-07 | -7.6E-08 |
| 3.4 | 8.9E-08 | 2.6E-07 | -1.1E-07 |
| 3.6 | 1.2E-07 | 3.1E-07 | -1.6E-07 |
| 3.8 | 1.6E-07 | 3.6E-07 | -2.1E-07 |
| 4 | 2.0E-07 | 4.2E-07 | -2.8E-07 |
| | 2.6E-07 | | |
| | 3.2E-07 | | |
| | 4.0E-07 | | |

DISPLAY APPARATUS

CROSS-REFERENCE TO RELATED APPLICATIONS

This application claims the priority benefit of the Korean Patent Application No. 10-2018-0132198 filed in the Republic of Korea on Oct. 31, 2018, which is hereby incorporated by reference as if fully set forth herein.

BACKGROUND

Technical Field

The present disclosure relates to a display apparatus.

Description of the Related Art

A display apparatus is widely used as a display screen of a notebook computer, a tablet computer, a smartphone, a portable display device, and a portable information device, in addition to a display apparatus of a television or a monitor.

Display apparatuses include a liquid crystal display apparatus and a light emitting display apparatus. Since the light emitting display apparatus displays an image by using a self-light emitting diode, it has high response speed and low power consumption, and has no problem in a viewing angle, whereby the light emitting display apparatus has been spotlighted as a next generation display apparatus.

The light emitting display apparatus includes a pixel circuit formed per pixel. The pixel circuit allows a light emitting diode to emit light by controlling a size of a current flowing from a driving power source to the light emitting diode by using switching of a driving thin film transistor according to a data voltage, thereby displaying a predetermined image.

In a general light emitting display apparatus, a current flowing to a light emitting diode of each pixel may be varied by a threshold voltage deviation of a driving transistor due to a process deviation, etc. Therefore, the pixel circuit of the general light emitting display apparatus cannot implement uniform picture quality as a data current output from the driving transistor is varied per pixel even when the pixels use the same data voltage, whereby the pixel circuit includes an internal compensation circuit for compensating for a threshold voltage of the driving transistor.

The recent trend is that the light emitting display apparatus, which is applied to a mobile electronic device, a virtual image display apparatus or a head mounted display apparatus, has a resolution that is gradually becoming higher and higher. Therefore, it is desired to subdivide gradation of the driving transistor to enhance resolution of the light emitting display apparatus.

BRIEF SUMMARY

The present disclosure has been made in view of the above problems, and it is an object of the present disclosure to provide a display apparatus including an oxide based driving transistor of a bottom gate mode to improve a subthreshold swing factor (S-factor) of a pixel circuit and subdivide gradation.

It is another object of the present disclosure to provide a display apparatus including a transistor having excellent turn-on characteristics, a transistor having excellent off-current characteristics, and a driving transistor having an excellent subthreshold swing factor (S-factor) to optimize the S-factor of the driving transistor.

It is still another object of the present disclosure to provide a display apparatus including a transistor arranged on a first circuit layer, a transistor arranged on a second circuit layer on the first circuit layer, and a driving transistor including a gate electrode arranged on the first circuit layer and a semiconductor layer arranged on the second circuit layer, in order to minimize a mask process and minimize a layout area of a pixel circuit.

It is further still another object of the present disclosure to provide a display apparatus that minimizes a mask process, improves a lithography process margin and has excellent reliability by forming an oxide based driving transistor through a back channel etch (BCE) process.

In addition to the objects of the present disclosure as mentioned above, additional objects and features of the present disclosure will be understood by those skilled in the art from the following description of the present disclosure.

In accordance with an aspect of the present disclosure, the above and other objects can be accomplished by the provision of a display apparatus including a plurality of pixels each including a pixel circuit having a driving transistor and a light emitting diode connected to the pixel circuit, the pixel circuit including a first circuit layer having a semiconductor layer of a first material arranged on a substrate and a transistor of a first type having a gate electrode arranged on the semiconductor layer of the first material, a circuit insulating layer arranged on the first circuit layer, and a second circuit layer having a semiconductor layer of a second material arranged on the circuit insulating layer, the second material being different from the first material, and a transistor of a second type having a gate electrode arranged on the semiconductor layer of the second material, and the driving transistor including a gate electrode arranged on the first circuit layer, and a semiconductor layer of a second material arranged on the second circuit layer.

In accordance with another aspect of the present disclosure, the above and other objects can be accomplished by the provision of a display apparatus including a plurality of pixels having a light emitting diode and a pixel circuit driving the light emitting diode, the pixel circuit including a first circuit layer having a transistor including a semiconductor layer of a first material arranged on a substrate, a circuit insulating layer arranged on the first circuit layer, a second circuit layer including a transistor having a semiconductor layer of a second material arranged on the circuit insulating layer, the second material being different from the first material, a driving transistor having a gate electrode arranged on the first circuit layer and a semiconductor layer of a second material arranged on the second circuit layer, and a storage capacitor including a first capacitor electrode made of the gate electrode of the driving transistor and a second capacitor electrode overlapped with the first capacitor electrode and electrically connected with a source electrode of the driving transistor.

Details of the other embodiments are included in the detailed description and drawings.

Since the display apparatus according to embodiments of the present disclosure includes an oxide based driving transistor of a bottom gate mode, it is possible to improve a subthreshold swing factor (S-factor) of a pixel circuit and subdivide gradation.

Since the display apparatus according to embodiments of the present disclosure includes a transistor having excellent an turn-on characteristic, a transistor having an excellent off-current characteristic, and a driving transistor having an excellent subthreshold swing factor (S-factor), it is possible to optimize the subthreshold swing factor (S-factor) of the driving transistor.

Since the display apparatus according to embodiments of the present disclosure includes a transistor arranged on a first circuit layer, a transistor arranged on a second circuit layer on the first circuit layer, and a driving transistor including a gate electrode arranged on the first circuit layer and a semiconductor layer arranged on the second circuit layer, it is possible to minimize a mask process and minimize a layout area of a pixel circuit.

Since the display apparatus according to embodiments of the present disclosure forms an oxide based driving transistor through a back channel etch (BCE) process, it is possible to minimize a mask process, improve a lithography process margin and obtain excellent reliability.

In addition to the effects of the present disclosure as mentioned above, additional advantages and features of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which:

FIG. 7 is a view illustrating a gradation region and a subthreshold area of each of a driving transistor, an initialization transistor and a light emitting control transistor in a pixel circuit shown in FIG. 4 according to an embodiment of the present disclosure.

DETAILED DESCRIPTION OF THE EMBODIMENTS

Figure 1:
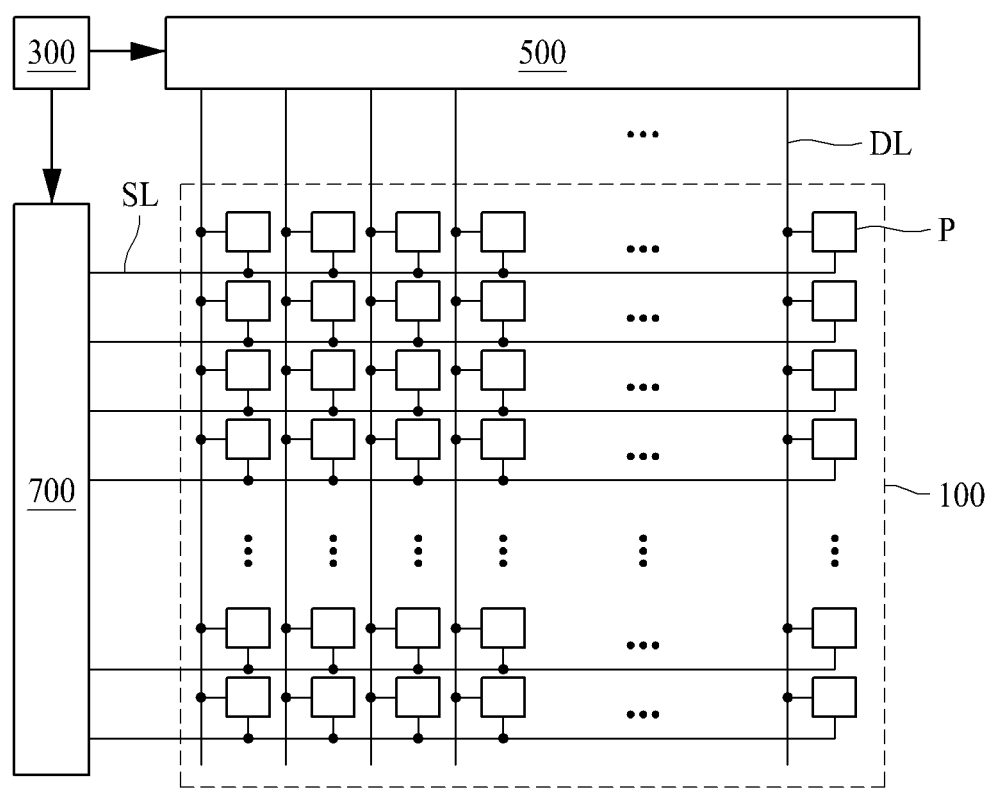
FIG. 1 is a plane view illustrating a display apparatus according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a situation where "comprise," "have," and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when the position relationship is described as "upon," "above," "below," and "next to," one or more portions may be arranged between two other portions unless "just" or "direct" is used.

In describing a time relationship, for example, when the temporal order is described as "after," "subsequent," "next," and "before," a situation which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display apparatus according to an example embodiment of the present disclosure will be described in detail with reference to the accompanying drawings. Wherever possible, the same reference numbers will be used throughout the drawings to refer to the same or like parts.

FIG. 1 is a plane view illustrating a display apparatus according to one embodiment of the present disclosure.

Referring to FIG. 1, a display apparatus according to one embodiment of the present disclosure can include a pixel array unit 100, a control circuit 300, a data driving circuit 500 (e.g., a data driver), and a scan driving circuit 700 (e.g., a gate driver).

The pixel array unit 100 can include a plurality of scan lines SL and a plurality of data lines DL provided on a substrate, and a plurality of pixels P respectively provided in a plurality of pixel areas defined by intersections of the plurality of scan lines SL and the plurality of data lines DL.

Each of the plurality of pixels P can include a pixel cell that displays an image based on a scan signal supplied from an adjacent scan line SL and a data signal supplied from an adjacent data line DL. In detail, the pixel cell can include at least one thin film transistor and at least one capacitor, and can be a liquid crystal cell that drives liquid crystals in accordance with an electric field based on a data signal to display an image, or can be a self-light emitting cell that self-emits light based on a data signal to display an image. In this situation, the self-light emitting cell can include a plasma discharging element, a quantum dot light-emitting element, an organic light-emitting element, an inorganic light-emitting element, or a micro light-emitting diode.

The control circuit 300 can generate pixel data corresponding to each of the plurality of pixels P based on an image signal. The control circuit 300 can generate a data control signal based on a timing synchronization signal to supply the data control signal to the data driving circuit 500. According to one example, the control circuit 300 can generate a scan control signal including a plurality of scan clock signals and a start signal based on the timing synchronization signal to supply the scan control signal to the scan driving circuit 700. The control circuit 300 can additionally generate a plurality of carry clock signals in accordance with a driving mode of the scan driving circuit 700 to supply the plurality of carry clock signals to the scan driving circuit 700.

The data driving circuit 500 can be connected to the plurality of data lines DL provided in the pixel array unit 100. The data driving circuit 500 can receive pixel data and the data control signal supplied from the control circuit 300, and can receive a plurality of reference gamma voltages supplied from a power source circuit. The data driving circuit 500 can convert the pixel data into a pixel-based analog data signal using the data control signal and the plurality of reference gamma voltages, and can supply the pixel-based data signal to a corresponding data line DL.

The scan driving circuit 700 can be connected to the plurality of scan lines SL provided in the pixel array unit 100. In detail, the scan driving circuit 700 can generate a scan signal in accordance with a predetermined order determined based on the scan control signal supplied from the control circuit 300 and supply the scan signal to a corresponding scan line SL.

According to one example, the scan driving circuit 700 can be integrated in one edge or both edges of the substrate in accordance with a manufacturing process of a thin film transistor and then connected to the plurality of scan lines SL in a one-to-one relationship. For example, the scan driving circuit 700 can be provided in an integrated circuit, can be packaged in either the substrate or a flexible circuit film, and can be connected to the plurality of scan lines SL in a one-to-one relationship.

Figure 2:
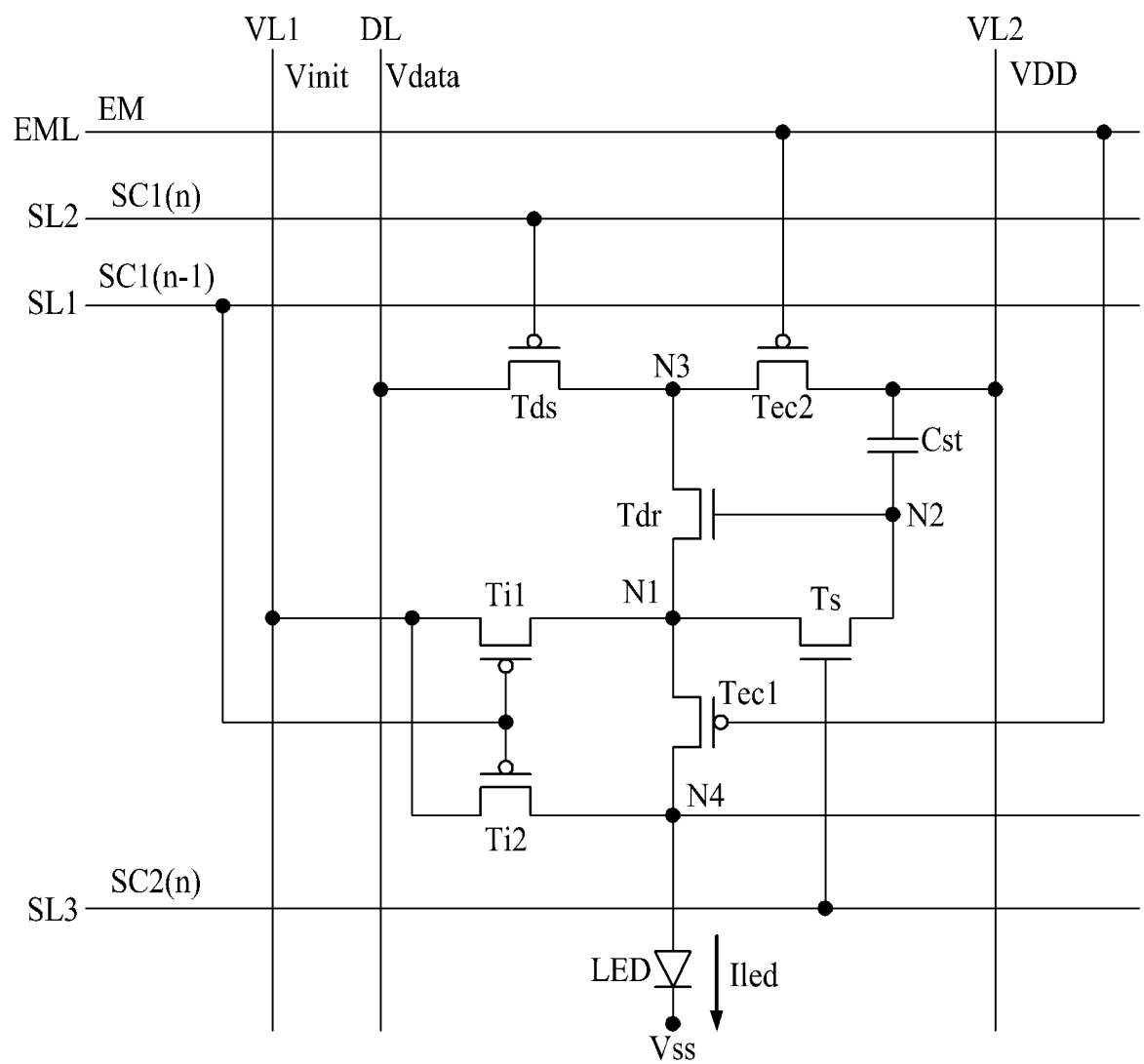
FIG. 2 is a circuit view illustrating a pixel circuit and a light emitting diode in a display apparatus according to an embodiment of the present disclosure.

FIG. 2 is a circuit view illustrating a pixel circuit and a light emitting diode in a display apparatus according to one embodiment of the present disclosure.

Referring to FIG. 2, each of the plurality of pixels P can include a pixel circuit having a driving transistor Tdr, and a light emitting diode LED connected to the pixel circuit.

The pixel circuit can drive the light emitting diode LED by controlling a driving current Iled flowing to the light emitting diode LED. According to one example, the pixel circuit can include a driving transistor Tdr, a sampling transistor Ts, first and second light emitting control transistors Tec1 and Tec2, first and second initialization transistors Ti1 and Ti2, a data supply transistor Tds, and a storage capacitor Cst.

The driving transistor Tdr can control the driving current Iled flowing to the light emitting diode LED. The driving transistor Tdr can selectively connect a first node N1 to a third node N3. In detail, the driving transistor Tdr can be connected between the first node N1 and the third node N3 to supply the driving current Iled to the first light emitting control transistor Tec1. For example, a drain electrode of the driving transistor Tdr can be connected with the third node N3, a source electrode of the driving transistor Tdr can be connected with the first node N1, and a gate electrode of the driving transistor Tdr can be connected with a second node N2.

The drain electrode of the driving transistor Tdr can be connected with a drain electrode of the second light emitting control transistor Tec2 and a drain electrode of the data supply transistor Tds through the third node N3. The source electrode of the driving transistor Tdr can be connected with a source electrode of the sampling transistor Ts, a drain electrode of the first initialization transistor Ti1 and a source electrode of the first light emitting control transistor Tec1 through the first node N1. The gate electrode of the driving transistor Tdr can be connected with one end of the storage capacitor Cst and a drain electrode of the sampling transistor Ts through the second node N2. Therefore, the driving transistor Tdr can be turned on based on a voltage of the second node N2 to supply the driving current Iled, which is supplied from the third node N3, to the first node N1.

According to one example, the driving transistor Tdr can include an oxide based semiconductor layer. The driving transistor Tdr can have a back channel etch (BCE) structure or bottom gate structure in which a semiconductor layer is exposed during a process of forming the source drain and the drain electrode. Therefore, as the display apparatus according to embodiments of the present disclosure includes a driving transistor Tdr having a back channel etch structure (BCE), it is possible to implement an image of high resolution by improving a subthreshold swing factor (S-factor) of the pixel circuit and subdividing gradation.

According to one example, the driving transistor Tdr can correspond to a different type of transistor than the first and second light emitting control transistors Tec1 and Tec2, the first and second initialization transistors Ti1 and Ti2, and the data supply transistor Tds. For example, the driving transistor Tdr can correspond to an n-type transistor, and the first and second light emitting control transistors Tec1 and Tec2, the first and second initialization transistors Ti1 and Ti2, and the data supply transistor Tds can correspond to p-type transistors. The driving transistor Tdr can output a current entering the drain electrode based on a voltage applied to the gate electrode through the source electrode. In this situation, although the drain electrode and the source electrode of the driving transistor Tdr can be changed depending on a direction of the current, the drain electrode and the source electrode of the driving transistor Tdr are determined based on a direction of a voltage of the third node N3, which is supplied to the first node N1, in accordance with a driving method of the pixels P.

The semiconductor layer of the driving transistor Tdr can be exposed to an etching gas or an etching solution during an etching and patterning process for forming the source electrode and the drain electrode. According to one example, the semiconductor layer of the driving transistor Tdr can include a first semiconductor layer corresponding to a channel layer or an active layer, and a second semiconductor layer arranged on the first semiconductor layer.

The first semiconductor layer can be made of an oxide semiconductor material, such as IZO (InZnO)-based, IGO (InGaO)-based, ITO (InSnO)-based, IGZO (InGaZnO)-based, IGZTO (InGaZnSnO)-based, GZTO (GaZnSnO)-based, GZO (GaZnO)-based, and ITZO (InSnZnO)-based. The first semiconductor layer is not limited to the above materials, and can be made of other oxide semiconductor materials known in the art.

The second semiconductor layer can be arranged on the first semiconductor layer to protect the first semiconductor layer from the etching gas or the etching solution during the etching and patterning process for forming the source electrode and the drain electrode. In detail, the second semiconductor layer can include nitrogen of a concentration higher than that of the first semiconductor layer, and can have film stability more excellent than that of the first semiconductor layer. For example, the nitrogen included in the second semiconductor layer can form a stable bonding with oxygen, and can stably be arranged between metal elements. Since the second semiconductor layer has excellent durability with respect to various processing, such as exposure, etching, patterning and heat treatment to manufacture the driving transistor Tdr, the second semiconductor can thereby protect the first semiconductor layer therebelow.

The sampling transistor Ts can selectively connect the first node N1 with the second node N2. In detail, the sampling transistor Ts can be turned on based on a third scan control signal SC2(n) to electrically connect the first node N1 with the second node N2. The drain electrode of the sampling transistor Ts can be connected with the second node N2, the source electrode of the sampling transistor Ts can be connected with the first node N1, and the gate electrode of the sampling transistor Ts can be connected with a third scan line SL3.

The drain electrode of the sampling transistor Ts can be connected with the gate electrode of the driving transistor Tdr and one end of the storage capacitor Cst through the second node N2. The source electrode of the sampling transistor Ts can be connected with the source electrode of the driving transistor Tdr, the source electrode of the first light emitting control transistor Tec1 and the drain electrode of the first initialization transistor Ti1 through the first node N1. The gate electrode of the sampling transistor Ts can receive the third scan control signal SC2(n) from the third scan line SL3. Therefore, the sampling transistor Ts can be turned on based on the third scan signal SC2(n) to supply the voltage of the second node N2 to the first node N1.

According to one example, the sampling transistor Ts can include an oxide based semiconductor layer. The sampling transistor Ts can have a coplanar structure in which a gate electrode is arranged above the oxide based semiconductor layer. As the sampling transistor Ts is implemented in a coplanar structure, excellent off current characteristic can be obtained and low frequency driving can be performed, whereby power consumption can be reduced. Therefore, as the display apparatus according to embodiments of the present disclosure includes a sampling transistor Ts having excellent off current characteristic, it is possible to prevent off current from flowing between the first node N1 and the second node N2 and stably maintain the gate-source voltage of the driving transistor Tdr.

According to one example, the sampling transistor Ts can correspond to a transistor that is a different type of transistor than the first and second light emitting control transistors Tec1 and Tec2, the first and second initialization transistors Ti1 and Ti2, and the data supply transistor Tds. For example, the sampling transistor Ts can correspond to an n-type transistor, and the first and second light emitting control transistors Tec1 and Tec2, the first and second initialization transistors Ti1 and Ti2, and the data supply transistor Tds can correspond to p-type transistors. The sampling transistor Ts can output a current entering the drain electrode based on the voltage applied to the gate electrode through the source electrode. In this situation, although the drain electrode and the source electrode of the sampling transistor Ts can be changed depending on a direction of the current, the drain electrode and the source electrode of the sampling transistor Ts are determined based on a direction of a voltage of the second node N2, which is supplied to the first node N1, in accordance with a driving method of the pixels P.

The first light emitting control transistor Tec1 can be turned on based on an emission signal EM to electrically connect the first node N1 with the fourth node N4. In detail, the source electrode of the first light emitting control transistor Tec1 can be connected with the first node N1, the drain electrode of the first light emitting control transistor Tec1 can be connected with the fourth node N4, and the gate electrode of the first light emitting control transistor Tec1 can be connected with an emission control line EML.

The source electrode of the first light emitting control transistor Tec1 can be connected with the source electrode of the driving transistor Tdr, the source electrode of the sampling transistor Ts and the drain electrode of the first initialization transistor Ti1 through the first node N1. The drain electrode of the first light emitting control transistor Tec1 can be connected with an anode electrode of the light emitting diode LED and the drain electrode of the second initialization transistor Ti2 through the fourth node N4. The gate electrode of the first light emitting control transistor Tec1 can receive the emission signal EM from the emission control line EML. Therefore, the first light emitting control transistor Tec1 can be turned on based on the emission signal EM to supply the driving current Iled to the light emitting diode LED.

According to one example, the first light emitting control transistor Tec1 can include a silicon based semiconductor layer. In detail, the first light emitting control transistor Tec1 can include a semiconductor layer made of low temperature polycrystalline silicon (LTPS). As the first light emitting control transistor Tec1 includes a semiconductor layer made of low temperature polycrystalline silicon, high electron mobility and excellent turn-on characteristic can be obtained. Therefore, as the display apparatus according to embodiments of the present disclosure includes a first light emitting control transistor Tec1 having excellent turn-on characteristic, it is possible to drive the pixel circuit stably and efficiently.

For example, the first light emitting control transistor Tec1 can correspond to a p-type transistor, and can output the current entering the source electrode based on the voltage applied to the gate electrode through the drain electrode. In this situation, although the source electrode and the drain electrode of the first light emitting control transistor Tec1 can be changed depending on a direction of the current, the source electrode and the drain electrode of the first light emitting control transistor Tec1 are determined based on a direction of the driving current output to the fourth node N4 in accordance with the driving method of the pixels P.

The second light emitting control transistor Tec2 can be turned on based on the emission signal EM to electrically connect a second voltage supply line VL2 with the third node N3. In detail, the source electrode of the second light emitting control transistor Tec2 can be connected with the second voltage supply line VL2, the drain electrode of the second light emitting control transistor Tec2 can be connected with the third node N3, and the gate electrode of the second light emitting control transistor Tec2 can be connected with the emission control line EML.

The source electrode of the second light emitting control transistor Tec2 can be supplied with a driving voltage VDD from the second voltage supply line VL2, and can be connected with the other end opposite to one end of the storage capacitor Cst connected to the second node N2. The drain electrode of the second light emitting control transistor Tec2 can be connected with the drain electrode of the driving transistor Tdr and the drain electrode of the data supply transistor Tds through the third node N3. The gate electrode of the second light emitting control transistor Tec2 can receive the emission signal EM from the emission control line EML. Therefore, the second light emitting control transistor Tec2 can be turned on based on the emission signal EM to supply the driving voltage VDD to the third node N3.

According to one example, the second light emitting control transistor Tec2 can include a silicon based semiconductor layer. In detail, the second light emitting control transistor Tec2 can include a semiconductor layer made of low temperature polycrystalline silicon (LTPS). As the second light emitting control transistor Tec2 includes a semiconductor layer made of low temperature polycrystalline silicon, high electron mobility and excellent turn-on characteristic can be obtained. Therefore, as the display apparatus according to embodiments of the present disclosure includes a second light emitting control transistor Tec2 having excellent turn-on characteristic, it is possible to drive the pixel circuit stably and efficiently.

For example, the second light emitting control transistor Tec2 can correspond to a p-type transistor, and can output the current entering the source electrode based on the voltage applied to the gate electrode through the drain electrode.

The first initialization transistor Ti1 can be turned on based on a first scan signal SC1($n$-1) to electrically connect the first voltage supply line VL1 with the first node N1. In detail, the source electrode of the first initialization transistor Ti1 can be connected with the first voltage supply line VL1, the drain electrode of the first initialization transistor Ti1 can be connected with the first node N1, and the gate electrode of the first initialization transistor Ti1 can be connected with the first voltage supply line VL1.

The source electrode of the first initialization transistor Ti1 can be supplied with an initialization voltage Vinit from the first voltage supply line VL1. The drain electrode of the first initialization transistor Ti1 can be connected with the source electrode of the driving transistor Tdr, the source electrode of the sampling transistor Ts and the source electrode of the first light emitting control transistor Tec1 through the first node N1. The gate electrode of the first initialization transistor Ti1 can receive the first scan signal SC1($n$-1) from the first scan line SL1. Therefore, the first initialization transistor Ti1 can be turned on based on the first scan signal SC1($n$-1) to supply the initialization voltage Vinit to the first node N1.

According to one example, the first initialization transistor Ti1 can include a silicon based semiconductor layer. In detail, the first initialization transistor Ti1 can include a semiconductor layer made of low temperature polycrystalline silicon (LTPS). As the first initialization transistor Ti1 includes a semiconductor layer made of low temperature polycrystalline silicon, high electron mobility and excellent turn-on characteristic can be obtained. Therefore, as the display apparatus according to embodiments of the present disclosure includes a first initialization transistor Ti1 having excellent turn-on characteristic, it is possible to drive the pixel circuit stably and efficiently.

For example, the first initialization transistor Ti1 can correspond to a p-type transistor, and can output the current entering the source electrode based on the voltage applied to the gate electrode through the drain electrode.

The second initialization transistor Ti2 can be turned on based on the first scan signal SC1($n$-1) to electrically connect the first voltage supply line VL1 with the fourth node N4. In detail, the source electrode of the second initialization transistor Ti2 can be connected with the first voltage supply line VL1, the drain electrode of the second initialization transistor Ti2 can be connected with the fourth node N4, and the gate electrode of the second initialization transistor Ti2 can be connected with the first voltage supply line VL1.

The source electrode of the second initialization transistor Ti2 can be supplied with the initialization voltage Vinit from the first voltage supply line VL1. The drain electrode of the second initialization transistor Ti2 can be connected with the anode electrode of the light emitting diode LED and the drain electrode of the first light emitting control transistor Tec1 through the fourth node N4. The gate electrode of the second initialization transistor Ti2 can receive the first scan signal SC1($n$-1) from the first scan line SL1. Therefore, the second initialization transistor Ti2 can be turned on based on the first scan signal SC1($n$-1) to supply the initialization voltage Vinit to the fourth node N4.

According to one example, the second initialization transistor Ti2 can include a silicon based semiconductor layer. In detail, the second initialization transistor Ti2 can include a semiconductor layer made of low temperature polycrystalline silicon (LTPS). As the second initialization transistor Ti2 includes a semiconductor layer made of low temperature polycrystalline silicon, high electron mobility and excellent turn-on characteristic can be obtained. Therefore, as the display apparatus according to embodiments of the present disclosure includes a second initialization transistor Ti2 having excellent turn-on characteristic, it is possible to drive the pixel circuit stably and efficiently.

For example, the second initialization transistor Ti2 can correspond to a p-type transistor, and can output the current entering the source electrode based on the voltage applied to the gate electrode through the drain electrode.

The data supply transistor Tds can be turned on based on a second scan signal SC1($n$) to electrically connect the data line DL with the third node N3. In detail, the source electrode of the data supply transistor Tds can be connected with the data line DL, the drain electrode of the data supply transistor Tds can be connected with the third node N3, and the gate electrode of the data supply transistor Tds can be connected with the second scan line SL2.

The source electrode of the data supply transistor Tds can be supplied with the data voltage Vdata from the data line DL. The drain electrode of the data supply transistor Tds can be connected with the drain electrode of the driving transistor Tdr and the drain electrode of the second light emitting control transistor Tec2 through the third node N3. The gate electrode of the data supply transistor Tds can receive the second scan signal SC1(n) from the second scan line SL2. Therefore, the data supply transistor Tds can be turned on based on the second scan signal SC1(n) to supply the data voltage Vdata to the third node N3.

According to one example, the data supply transistor Tds can include a silicon based semiconductor layer. In detail, the data supply transistor Tds can include a semiconductor layer made of low temperature polycrystalline silicon (LTPS). As the data supply transistor Tds includes a semiconductor layer made of low temperature polycrystalline silicon, high electron mobility and excellent turn-on characteristic can be obtained. Therefore, as the display apparatus according to embodiments of the present disclosure includes a data supply transistor Tds having excellent turn-on characteristic, it is possible to drive the pixel circuit stably and efficiently.

For example, the data supply transistor Tds can correspond to a p-type transistor, and can output the current entering the source electrode based on the voltage applied to the gate electrode through the drain electrode.

According to one example, as the display apparatus according to embodiments of the present disclosure includes n-type driving transistor Tdr and sampling transistor Ts, and includes p-type first and second light emitting control transistors Tec1 and Tec2, first and second initialization transistors Ti1 and Ti2, and data supply transistor Tds, it is possible to minimize the configuration of the scan line SL and drive the pixel circuit based on the minimum scan signal.

The storage capacitor Cst can be connected between the second voltage supply line VL2 and the second node N2. In detail, the storage capacitor Cst can store a differential voltage between the second voltage supply line VL2 and the second node N2 to control the voltage of the second node N2. For example, since the driving voltage VDD applied to the other end of the storage capacitor Cst is uniformly maintained even though the sampling transistor Ts is turned off, the voltage of the second node N2, which is applied to one end of the storage capacitor Cst, can uniformly be maintained. As a result, since the storage capacitor Cst uniformly maintains the voltage of the second node N2 even though the sampling transistor Ts is turned off, the storage capacitor Cst can control the operation of the driving transistor Tdr.

For example, if the pixel circuit for driving the light emitting diode includes only a plurality of transistors having an excellent subthreshold swing factor (S-factor), includes only a plurality of transistors having excellent off current characteristic or includes only a plurality of transistors having excellent turn-on characteristic, a limit value of the subthreshold swing factor (S-factor) exists to consider all of the subthreshold swing factor (S-factor), the off current characteristic, and the turn-on characteristic.

Consequently, as the display apparatus according to embodiments of the present disclosure includes the driving transistor Tdr having excellent subthreshold swing factor (S-factor), the sampling transistor Ts having excellent off current characteristic, and the first and second light emitting control transistors Tec1 and Tec2, the first and second initialization transistors Ti1 and Ti2 and the data supply transistor Tds, each of which has excellent turn-on characteristic, it is possible to satisfy the excellent off current and turn-on characteristics and at the same time maximize the subthreshold swing factor (S-factor) of the driving transistor Tdr to subdivide gradation.

The light emitting diode LED can emit light by receiving the driving current Iled from the pixel circuit. In detail, the anode electrode of the light emitting diode LED can be connected with the fourth node N4 which is the source electrode of the first light emitting control transistor Tec1 connected with the driving transistor Tdr in series.

According to one example, the light emitting diode LED can include an anode electrode connected to the fourth node N4, a light emitting layer formed on the anode electrode, and a cathode electrode connected to the light emitting layer.

The anode electrode can be arranged on an opening portion of the pixel P, and can electrically be connected with the fourth node N4.

The light emitting layer can be arranged on the anode electrode. For example, the light emitting layer can have a structure of a hole transporting layer/a light emitting layer/an electron transporting layer, or a structure of a hole injection layer/hole transporting layer/a light emitting layer/an electron transporting layer/an electron injection layer. The light emitting layer can further include a function layer for improving emission efficiency and lifespan of the light emitting layer.

The cathode electrode can be formed along a length direction of the scan line SL or the data line DL, or can commonly be connected to all of the pixels P. According to one example, the cathode electrode can receive a common power source Vss from the data driving circuit 500 or a power supply circuit. In this way, the light emitting diode LED can emit light based on the driving current Iled flowing in accordance with driving of the driving transistor Tdr.

Figure 3:
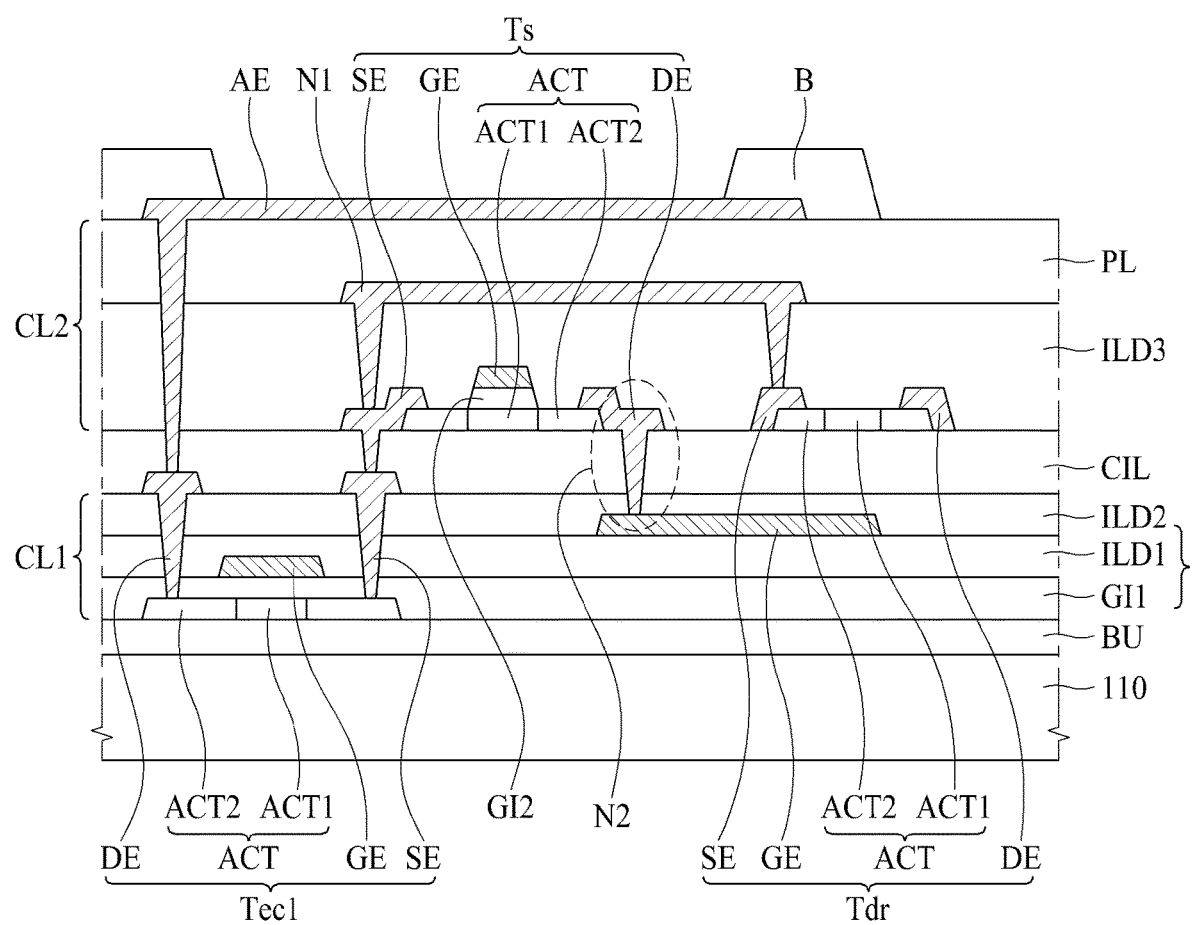
FIG. 3 is a layout cross-sectional view illustrating a deposition relation of a driving transistor, a sampling transistor and a first light emitting control transistor in a pixel circuit shown in FIG. 2 according to an embodiment of the present disclosure.

FIG. 3 is a layout cross-sectional view illustrating a deposition relation of a driving transistor, a sampling transistor and a first light emitting control transistor in a pixel circuit shown in FIG. 2.

Referring to FIGS. 2 and 3, the display apparatus can include a substrate 110, a buffer layer BU, a first circuit layer CL1, a circuit insulating layer CIL, a second circuit layer CL2, an anode electrode AE of an light emitting diode LED, and a bank B.

The substrate 110 is a base substrate, and can be a transparent flexible substrate that can be curved or bent. According to one example, the substrate 110 can include, but is not limited to, a polyimide material. The substrate 110 can be made of a transparent plastic material, such as polyethylene terephthalate. Considering that a deposition process of a high temperature is performed, polyimide having excellent heat resistance tolerable at a high temperature can be used as the substrate 110 of a polyimide material.

According to one example, the substrate 110 can be a glass substrate. For example, the substrate 110 can include $SiO_2$ or $Al_2O_3$ as a main component.

The buffer layer BU can be arranged on the substrate 110. According to one example, the buffer layer BU can be formed in such a manner that a plurality of inorganic films are deposited. For example, the buffer layer BU can be formed of a multi-layered film of one or more inorganic films of a silicon oxide film (SiOx), a silicon nitride film (SiNx) and SiON, which are deposited. The buffer layer BU can be formed on the entire upper surface of the substrate 110 to prevent water from being permeated into the light emitting diode through the substrate 110. Therefore, as the buffer layer BU includes a plurality of inorganic films, the buffer layer BU can improve a water vapor transmission rate (WVTR) of a panel.

The first circuit layer CL1 can include a first gate insulating film GI1, first and second inter-layer dielectric ILD1 and ILD2, first and second light emitting control transistors Tec1 and Tec2, first and second initialization transistors Ti1 and Ti2, and a data supply transistor Tds. The first circuit layer CL1 can include a transistor of a first type. For example, the transistor of the first type can include a semiconductor layer ACT made of low temperature polycrystalline silicon (LTPS).

The first light emitting control transistor Tec1 can include a silicon based semiconductor layer. In detail, the first light emitting control transistor Tec1 can include a semiconductor layer ACT made of low temperature polycrystalline silicon (LTPS). As the first light emitting control transistor Tec1 includes a semiconductor layer made of low temperature polycrystalline silicon (LTPS), in which high electron mobility and an excellent turn-on characteristic can be obtained.

The semiconductor layer ACT of the first light emitting control transistor Tec1 can be arranged on the buffer layer BU, and can be overlapped with the gate electrode GE, the source electrode SE, and the drain electrode DE. The semiconductor layer ACT can directly be in contact with the source electrode SE and the drain electrode DE, and can face the gate electrode GE by interposing the first gate insulating film GI1 therebetween.

According to one example, the semiconductor layer ACT can include a channel area ACT1 and source/drain areas ACT2. The channel area ACT1 can be formed on a center area of the semiconductor layer ACT, and the source/drain areas ACT2 can be formed in parallel with each other by interposing the channel area ACT1 therebetween. The channel area ACT1 can be overlapped with the gate electrode GE, and the source/drain areas ACT2 can be overlapped with the source electrode SE and the drain electrode DE.

The first gate insulating film GI1 can be provided on the semiconductor layer ACT of the first light emitting control transistor Tec1. The first gate insulating film GI1 can be provided on the buffer layer BU. In detail, the first gate insulating film GI1 can insulate the semiconductor layer ACT from the gate electrode GE.

The first light emitting control transistor Tec1 can further include a gate electrode GE, a source electrode SE, and a drain electrode DE.

The gate electrode GE of the first light emitting control transistor Tec1 can be provided on the first gate insulating film GI1. The gate electrode GE can be overlapped with the channel area ACT1 of the semiconductor layer ACT by interposing the first gate insulating film GI1 therebetween.

The first and second inter-layer dielectric films ILD1 and ILD2 can sequentially be deposited on the gate electrode GE. The first and second inter-layer dielectric films ILD1 and ILD2 can be provided on the first gate insulating film GI1 to protect the first light emitting control transistor Tec1. A corresponding area of the first and second inter-layer dielectric films ILD1 and ILD2 can be removed to allow the active layer ACT to be in contact with the source electrode SE or the drain electrode DE. For example, the first and second inter-layer dielectric films ILD1 and ILD2 can include a contact hole through which the source electrode SE passes, and a contact hole through which the drain electrode DE passes.

The source electrode SE and the drain electrode DE of the first light emitting control transistor Tec1 can be provided to be spaced apart from each other on the second inter-layer dielectric film ILD2. The drain electrode DE can be in contact with one end of the source/drain areas ACT2 of the active layer ACT through the contact hole provided in the first gate insulating film GI1 and the first and second inter-layer dielectric films ILD1 and ILD2, and the source electrode SE can be in contact with the other end of the source/drain areas ACT2 of the active layer ACT through the contact hole provided in the first gate insulating film GI1 and the first and second inter-layer dielectric films ILD1 and ILD2.

The drain electrode DE of the first light emitting control transistor Tec1 can directly be in contact with the anode electrode AE that passes through a contact hole provided in the circuit insulating layer CIL, a third inter-layer dielectric film ILD3, and a planarization layer PL. As shown in FIG. 2, the drain electrode DE of the first light emitting control transistor Tec1 and the anode electrode AE of the light emitting diode LED can electrically be connected to the fourth node N4.

The source electrode SE of the first light emitting control transistor Tec1 can directly be in contact with the source electrode SE of the sampling transistor Ts that passes through the contact hole provided in the circuit insulating layer CIL, the source electrode SE of the sampling transistor Ts can directly be in contact with the first node electrode N1 (or the first node N1) that passes through the contact hole provided in the third inter-layer dielectric film ILD3, and the first node electrode N1 can directly be in contact with the source electrode SE of the driving transistor Tdr arranged on the circuit insulating layer CIL through the contact hole provided in the third inter-layer dielectric film ILD3. As shown in FIG. 2, the source electrode SE of the first light emitting control transistor Tec1, the source electrode SE of the sampling transistor Ts and the source electrode SE of the driving transistor Tdr can electrically be connected to the first node N1.

According to one example, each of the second light emitting control transistor Tec2, the first and second initialization transistors Ti1 and Ti2, and the data supply transistor Tds can further include a semiconductor layer arranged on the same layer as the semiconductor layer ACT of the first light emitting control transistor Tec1 and formed of the same material as that of the semiconductor layer ACT of the first light emitting control transistor Tec1.

Each of the second light emitting control transistor Tec2, the first and second initialization transistors Ti1 and Ti2, and the data supply transistor Tds can further include a gate electrode, a source electrode, and a drain electrode, which are arranged on the same layer as the gate electrode GE, the source electrode SE and the drain electrode DE of the first light emitting control transistor Tec1 and formed of the same material as that of the gate electrode GE, the source electrode SE and the drain electrode DE of the first light emitting control transistor Tec1.

In this way, as each of the first and second light emitting control transistors Tec1 and Tec2, the first and second initialization transistors Ti1 and Ti2, and the data supply transistor Tds includes a semiconductor layer made of low temperature polycrystalline silicon (LTPS), high electron mobility and excellent turn-on characteristic can be obtained. Therefore, as the display apparatus according to embodiments of the present disclosure includes the first and second light emitting control transistors Tec1 and Tec2, the first and second initialization transistors Ti1 and Ti2, and the data supply transistor Tds, it is possible to drive the pixel circuit stably and efficiently.

The first circuit layer CL1 can further include the gate electrode GE of the driving transistor Tdr. In detail, the gate electrode GE of the driving transistor Tdr can be arranged on the first inter-layer dielectric film ILD1 and covered by the second inter-layer dielectric film ILD2. That is, the gate electrode of the driving transistor Tdr can be insulated from the active layer ACT, the source electrode SE and the drain electrode DE of the driving transistor Tdr by the second inter-layer dielectric film ILD2 and the circuit insulating layer CIL.

In this way, as the gate electrode GE of the driving transistor Tdr is arranged on the first circuit layer CL1 and the active layer ACT of the driving transistor Tdr is arranged on the second circuit layer CL2 on the first circuit layer CL1, the driving transistor Tdr can have a back channel etch (BCE) structure. Therefore, as the display apparatus according to embodiments of the present disclosure includes a driving transistor Tdr having a back channel etch structure (BCE), it is possible to implement an image of high resolution by improving a subthreshold swing factor (S-factor) of the pixel circuit and subdividing gradation.

The circuit insulating layer CIL can be arranged on the first circuit layer CL1 to insulate the first circuit layer CL1 and the second circuit layer CL2 from each other. For example, the circuit insulating layer CIL can be made of an organic insulating material and an inorganic insulating material.

According to one example, the circuit insulating layer CIL can be formed at a relatively thick thickness to planarize the upper surface of the first circuit layer CIL. According to another example, the circuit insulating layer CIL can be formed at a relatively thin thickness to have a shape that follows a surface shape and contours of the first circuit layer CIL as it is.

The second circuit layer CL2 can include a second gate insulating GI2, a third inter-layer dielectric film ILD3, a planarization layer PL, and a sampling transistor Ts. The second circuit layer CL2 can include a transistor of a second type. For example, the transistor of the second type can have a coplanar structure in which a gate electrode GE is arranged above the oxide based semiconductor layer ACT.

The sampling transistor Ts can include an oxide based semiconductor layer ACT. The sampling transistor Ts can have a coplanar structure in which a gate electrode GE is arranged above the oxide based semiconductor layer ACT. As the sampling transistor Ts is implemented in a coplanar structure, excellent off current characteristic can be obtained and low frequency driving can be performed, whereby power consumption can be reduced.

The semiconductor layer ACT of the sampling transistor Ts can be arranged on the circuit insulating layer CIL, and can be overlapped with the gate electrode GE, the source electrode SE, and the drain electrode DE. The semiconductor layer ACT can directly be in contact with the source electrode SE and the drain electrode DE, and can face the gate electrode GE by interposing the second gate insulating film GI2 therebetween.

According to one example, the semiconductor layer ACT of the sampling transistor Ts can include a channel area ACT1 and source/drain areas ACT2. The channel area ACT1 can be formed on a center area of the semiconductor layer ACT, and the source/drain areas ACT2 can be formed in parallel with each other by interposing the channel area ACT1 therebetween. The channel area ACT1 can be overlapped with the gate electrode GE, and the source/drain areas ACT2 can be overlapped with the source electrode SE and the drain electrode DE.

The second gate insulating film GI2 can be provided on the semiconductor layer ACT of the sampling transistor Ts. In detail, the second gate insulating film GI2 can insulate the semiconductor layer ACT from the gate electrode GE.

The sampling transistor Ts can further include a gate electrode GE, a source electrode SE, and a drain electrode DE.

The gate electrode GE of the sampling transistor Ts can be provided on the second gate insulating film GI2. The gate electrode GE can be overlapped with the channel area ACT1 of the semiconductor layer ACT by interposing the second gate insulating film GI2 therebetween.

The source electrode SE of the sampling transistor Ts can be provided on the circuit insulating layer CIL while covering one end of the source/drain areas ACT2 of the semiconductor layer ACT. The drain electrode DE of the sampling transistor Ts can be provided on the circuit insulating layer CIL while covering the other end of the source/drain areas ACT2 of the semiconductor layer ACT. Each of the source electrode SE and the drain electrode DE of the sampling transistor Ts can be spaced apart from the channel area ACT1 of the semiconductor layer ACT.

The source electrode SE of the sampling transistor Ts can directly be in contact with the source electrode SE of the first light emitting control transistor Tec1 through a contact hole provided in the circuit insulating layer CIL. The source electrode SE of the sampling transistor Ts can directly be in contact with the first node electrode N1 (or the first node N1) that passes through the contact hole provided in the third inter-layer dielectric film ILD3. As shown in FIG. 2, the source electrode SE of the sampling transistor Ts, the source electrode SE of the first light emitting control transistor Tec1 and the source electrode SE of the driving transistor Tdr can electrically be connected to the first node N1.

The drain electrode DE of the sampling transistor Ts can directly be in contact with the gate electrode GE of the driving transistor Tdr through a contact hole provided in the circuit insulating layer CIL and the second inter-layer dielectric film ILD2. As shown in FIG. 2, the drain electrode DE of the sampling transistor Ts and the gate electrode of the driving transistor Tdr can electrically be connected to the second node N2.

The third inter-layer dielectric film ILD3 can cover all of the semiconductor layer ACT, the gate electrode GE, the source electrode SE and the drain electrode DE of the sampling transistor Ts. That is, the third inter-layer dielectric film ILD3 can be arranged on the sampling transistor Ts to protect the sampling transistor Ts. A corresponding area of the third inter-layer dielectric film ILD3 can be removed to allow one end of the first node electrode N1 to be in contact with the source electrode SE of the sampling transistor Ts, and a corresponding area of the third inter-layer dielectric film ILD3 can be removed to allow the other end of the first node electrode N1 to be in contact with the source electrode SE of the driving transistor Tdr. For example, the third inter-layer dielectric film ILD3 can include a contact hole through which one end of the first node electrode N1 passes, and a contact hole through which the other end of the first node electrode N1 passes.

As described above, as the sampling transistor Ts is arranged on the second circuit layer CL2 and implemented in the coplanar structure that includes an oxide based semiconductor layer ACT, excellent off current characteristic can be obtained and low frequency driving can be performed, whereby power consumption can be reduced. Therefore, as the display apparatus according to embodiments of the present disclosure includes a sampling transistor Ts having excellent off current characteristic, it is possible to prevent off current from flowing between the first node N1 and the second node N2 and stably maintain the gate-source voltage of the driving transistor Tdr.

The first node electrode N1 can be arranged on the third inter-layer dielectric film ILD3, and can directly be in contact with each of the source electrode SE of the sampling transistor Ts and the source electrode SE of the driving transistor Tdr through the contact hole provided in the third inter-layer dielectric film ILD3.

The planarization layer PL can be arranged on the substrate 110, and can cover all of the transistors arranged on the display area AA. In detail, the planarization layer PL can be provided on the third inter-layer dielectric film ILD3 to planarize the upper end of the pixel circuit. For example, the planarization layer PL can include a contact hole through which the anode electrode AE passes. In this situation, the contact hole of the planarization layer PL can be connected with the contact hole of the third inter-layer dielectric film ILD3 to allow the anode electrode AE to pass therethrough.

The second circuit layer CL2 can further include the semiconductor layer ACT, the source electrode SE and the drain electrode DE of the driving transistor Tdr. In detail, the semiconductor layer ACT of the driving transistor Tdr can be arranged on the circuit insulating layer CIL, and can be overlapped with the gate electrode GE, the source electrode SE and the drain electrode DE. The semiconductor layer ACT can directly be in contact with the source electrode SE and the drain electrode DE, and can face the gate electrode GE by interposing the second inter-layer dielectric film ILD2 and the circuit insulating layer CIL therebetween.

According to one example, the semiconductor layer ACT of the driving transistor Tdr can include a channel area ACT1 and source/drain areas ACT2. The channel area ACT1 can be formed on a center area of the semiconductor layer ACT, and the source/drain areas ACT2 can be formed in parallel with each other by interposing the channel area ACT1 therebetween. The channel area ACT1 can be overlapped with the gate electrode GE, and the source/drain areas ACT2 can be overlapped with the source electrode SE and the drain electrode DE.

The source electrode SE of the driving transistor Tdr can be provided on the circuit insulating layer CIL while covering one end of the source/drain areas ACT2 of the semiconductor layer ACT. The drain electrode DE of the driving transistor Tdr can be provided on the circuit insulating layer CIL while covering the other end of the source/drain areas ACT2 of the semiconductor layer ACT. Each of the source electrode SE and the drain electrode DE of the driving transistor Tdr can be spaced apart from the channel area ACT1 of the semiconductor layer ACT.

The source electrode SE of the driving transistor Tdr can directly be in contact with the other end of the first node electrode N1 that passes through the contact hole provided in the third inter-layer dielectric film ILD3. As shown in FIG. 2, the source electrode SE of the sampling transistor Ts, the source electrode SE of the first light emitting control transistor Tec1 and the source electrode SE of the driving transistor Tdr can electrically be connected to the first node N1.

The semiconductor layer ACT, the source electrode SE and the drain electrode DE of the driving transistor Tdr can be insulated from the gate electrode GE arranged on the first circuit layer CL1 by the second inter-layer dielectric film ILD2 and the circuit insulating layer CIL. In this way, as the gate electrode GE of the driving transistor Tdr is arranged on the first circuit layer CL1 and the active layer ACT of the driving transistor Tdr is arranged on the second circuit layer CL2 on the first circuit layer CL1, the driving transistor Tdr can have a back channel etch (BCE) structure. Therefore, as the display apparatus according to embodiments of the present disclosure includes a driving transistor Tdr having a back channel etch structure (BCE), it is possible to implement an image of high resolution by improving a subthreshold swing factor (S-factor) of the pixel circuit and subdividing gradation.

For example, if the pixel circuit for driving the light emitting diode includes only a plurality of transistors having an excellent subthreshold swing factor (S-factor), or includes only a plurality of transistors having excellent off current characteristic, or includes only a plurality of transistors having excellent turn-on characteristic, a limit value of the subthreshold swing factor (S-factor) exists to consider all of the subthreshold swing factor (S-factor), the off current characteristic, and the turn-on characteristic.

Consequently, as the display apparatus according to embodiments of the present disclosure includes the driving transistor Tdr having excellent subthreshold swing factor (S-factor), the sampling transistor Ts having excellent off current characteristic, and the first and second light emitting control transistors Tec1 and Tec2, the first and second initialization transistors Ti1 and Ti2 and the data supply transistor Tds, each of which has excellent turn-on characteristic, it is possible to satisfy the excellent off current and turn-on characteristics and at the same time maximize the subthreshold swing factor (S-factor) of the driving transistor Tdr to subdivide gradation. In other words, the pixel circuit according to an embodiment, can include a mix of different types of transistors in order to provide the best combination for implementing high resolution and increased subthreshold swing factor (S-factor).

The anode electrode AE of the light emitting diode LED can be arranged in an opening portion of each of the plurality of pixels on the planarization layer PL. In detail, the anode electrode AE can be surrounded by a bank B that defines the opening portion of each of the plurality of pixels. A portion of the anode electrode AE can be covered by the bank B, and another portion of the anode electrode AE can be exposed through the opening portion without being covered by the bank B.

Figure 4:
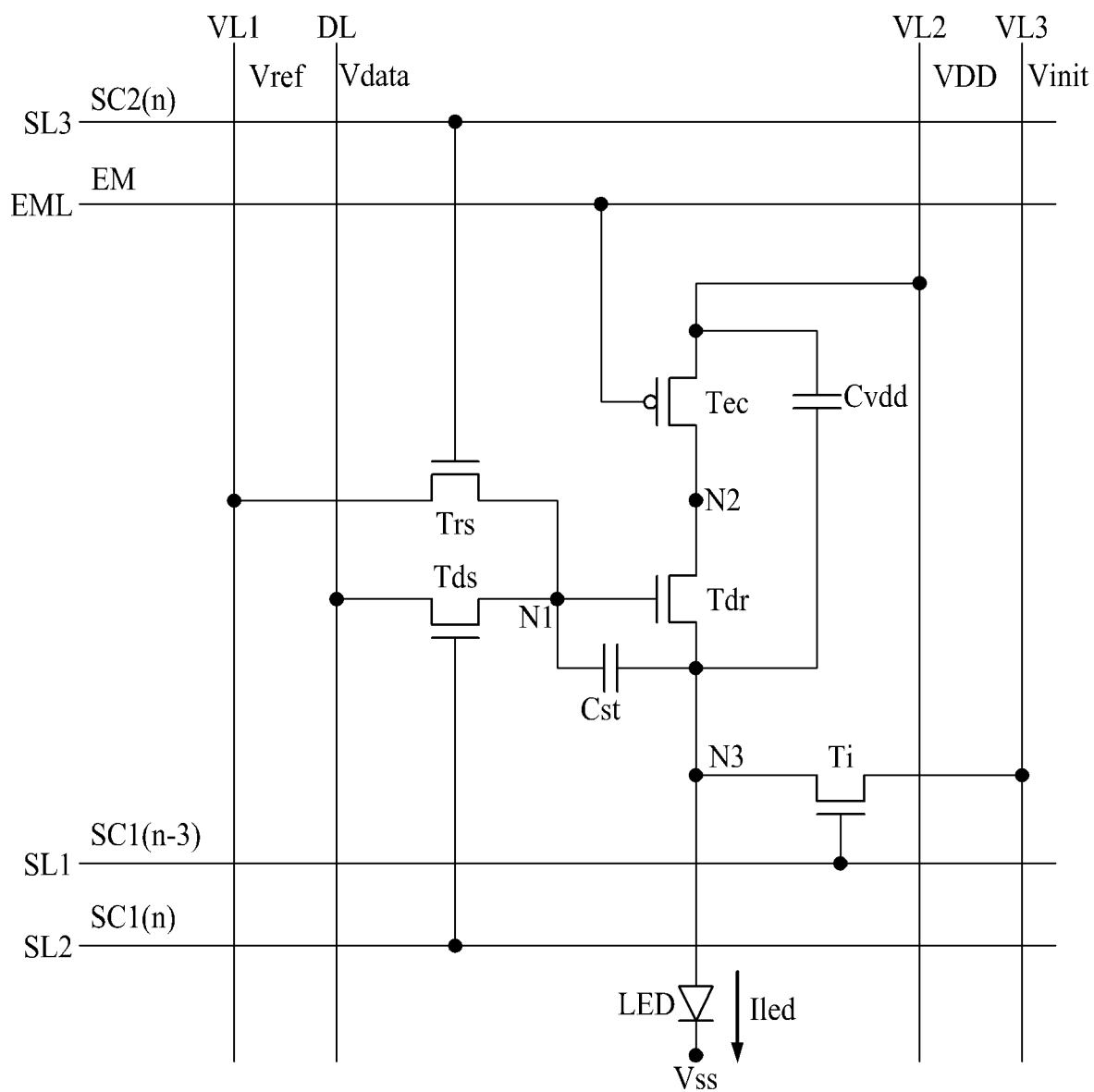
FIG. 4 is a circuit view illustrating a pixel circuit in a display apparatus according to another embodiment of the present disclosure.

FIG. 4 is a circuit view illustrating a pixel circuit in a display apparatus according to another embodiment of the present disclosure.

Referring to FIG. 4, each of the plurality of pixels P can include a pixel circuit having a driving transistor Tdr, and a light emitting diode LED connected to the pixel circuit.

The pixel circuit can drive the light emitting diode LED by controlling a driving current Iled flowing to the light emitting diode LED. According to one example, the pixel circuit can include a driving transistor Tdr, a reference supply transistor Trs, a data supply transistor Tds, an initialization transistor Ti, a light emitting control transistor Tec, a storage capacitor Cst, and a driving voltage capacitor Cvdd.

The driving transistor Tdr can control the driving current Iled flowing to the light emitting diode LED. The driving transistor Tdr can selectively connect a second node N2 to a third node N3. In detail, the driving transistor Tdr can be connected between the second node N2 and the third node N3 to supply the driving current Iled to the light emitting diode LED. For example, a drain electrode of the driving transistor Tdr can be connected with the second node N2, a source electrode of the driving transistor Tdr can be connected with the third node N3, and a gate electrode of the driving transistor Tdr can be connected with a first node N1.

The drain electrode of the driving transistor Tdr can be connected with a drain electrode of the light emitting control transistor Tec through the second node N2. The source electrode of the driving transistor Tdr can be connected with a source electrode of the initialization transistor Ti, one end of the storage capacitor Cst, and one end of the driving voltage capacitor Cvdd through the third node N3. The gate electrode of the driving transistor Tdr can be connected with a source electrode of the reference supply transistor Trs, a source electrode of the data supply transistor Tds and the other end of the storage capacitor Cst through the first node N1. Therefore, the driving transistor Tdr can be turned on based on a voltage of the first node N1 to supply the driving current Iled, which is supplied from the second node N2, to the third node N3.

According to one example, the driving transistor Tdr can include an oxide based semiconductor layer. The driving transistor Tdr can have a back channel etch (BCE) structure or bottom gate structure in which a semiconductor layer is exposed during a process of forming the source drain and the drain electrode. Therefore, as the display apparatus according to embodiments of the present disclosure includes a driving transistor Tdr having a back channel etch structure (BCE), it is possible to implement an image of high resolution by improving a subthreshold swing factor (S-factor) of the pixel circuit and subdividing gradation.

According to one example, the driving transistor Tdr can correspond to a different type of transistor than the light emitting control transistor Tec. For example, the driving transistor Tdr can correspond to an n-type transistor, and the light emitting control transistors Tec can correspond to a p-type transistor. The driving transistor Tdr can output a current entering the drain electrode based on a voltage applied to the gate electrode through the source electrode. In this situation, although the drain electrode and the source electrode of the driving transistor Tdr can be changed depending on a direction of the current, the drain electrode and the source electrode of the driving transistor Tdr are determined based on a direction of a voltage of the second node N2, which is supplied to the third node N3, in accordance with a driving method of the pixels P.

The semiconductor layer of the driving transistor Tdr can be exposed to an etching gas or an etching solution during an etching and patterning process for forming the source electrode and the drain electrode. According to one example, the semiconductor layer of the driving transistor Tdr can include a first semiconductor layer corresponding to a channel layer or an active layer, and a second semiconductor layer arranged on the first semiconductor layer.

The first semiconductor layer can be made of an oxide semiconductor material, such as IZO (InZnO)-based, IGO (InGaO)-based, ITO (InSnO)-based, IGZO (InGaZnO)-based, IGZTO (InGaZnSnO)-based, GZTO (GaZnSnO)-based, GZO (GaZnO)-based, and ITZO (InSnZnO)-based. The first semiconductor layer is not limited to the above materials, and can be made of other oxide semiconductor materials known in the art.

The second semiconductor layer can be arranged on the first semiconductor layer to protect the first semiconductor layer from the etching gas or the etching solution during the etching and patterning process for forming the source electrode and the drain electrode. In detail, the second semiconductor layer can include nitrogen of a concentration higher than that of the first semiconductor layer, and can have film stability more excellent than that of the first semiconductor layer. For example, the nitrogen included in the second semiconductor layer can form a stable bonding with oxygen, and can stably be arranged between metal elements. Since the second semiconductor layer has excellent durability with respect to processes, such as exposure, etching, patterning and heat treatment to manufacture the driving transistor Tdr, thereby protecting the first semiconductor layer therebelow.

The reference supply transistor Trs can be turned on based on a third scan control signal $SC2(n)$ to electrically connect a first voltage supply line VL1 with the first node N1. In detail, the drain electrode of the reference supply transistor Trs can be connected with the first voltage supply line VL1, the source electrode of the reference supply transistor Trs can be connected with the first node N1, and the gate electrode of the reference supply transistor Trs can be connected with a third scan line SL3.

The drain electrode of the reference supply transistor Trs can be connected with a reference voltage Vref from the first voltage supply line VL1. The source electrode of the reference supply transistor Trs can be connected with gate electrode of the driving transistor Tdr, the source electrode of the data supply transistor Tds and the other end of the storage capacitor Cst through the first node N1. The gate electrode of the reference supply transistor Trs can receive the third scan control signal $SC2(n)$ from the third scan line SL3. Therefore, the reference supply transistor Trs can be turned on based on the third scan signal $SC2(n)$ to supply the reference voltage Vref to the first node N1.

According to one example, the reference supply transistor Trs can include an oxide based semiconductor layer. The reference supply transistor Trs can have a coplanar structure in which a gate electrode is arranged above the oxide based semiconductor layer. As the reference supply transistor Trs is implemented in a coplanar structure, excellent off current characteristic can be obtained and low frequency driving can be performed, whereby power consumption can be reduced. Therefore, as the display apparatus according to embodiments of the present disclosure includes a reference supply transistor Trs having excellent off current characteristic, it is possible to prevent off current from flowing between the first voltage supply line VL1 and the first node N1 and stably maintain the voltage of the first node N1.

According to one example, the reference supply transistor Trs can correspond to a different type of transistor than the light emitting control transistor Tec. For example, the reference supply transistor Trs can correspond to an n-type transistor, and the light emitting control transistor Tec can correspond to a p-type transistor. The reference supply transistor Trs can output a current entering the drain electrode based on the voltage applied to the gate electrode through the source electrode. In this situation, although the drain electrode and the source electrode of the reference supply transistor Trs can be changed depending on a direction of the current, the drain electrode and the source electrode of the reference supply transistor Trs are determined based on a direction of the reference voltage Vref, which is supplied to the first node N1, in accordance with a driving method of the pixels P.

The data supply transistor Tds can be turned on based on a second scan signal $SC1(n)$ to electrically connect the data line DL with the first node N1. In detail, the drain electrode of the data supply transistor Tds can be connected with the data line DL, the source electrode of the data supply transistor Tds can be connected with the first node N1, and the gate electrode of the data supply transistor Tds can be connected with the second scan line SL2.

The drain electrode of the data supply transistor Tds can be supplied with the data voltage Vdata from the data line DL. The source electrode of the data supply transistor Tds can be connected with the gate electrode of the driving transistor Tdr, the source electrode of the reference supply transistor Trs and the other end of the storage capacitor Cst through the first node N1. The gate electrode of the data supply transistor Tds can receive the second scan signal SC1(n) from the second scan line SL2. Therefore, the data supply transistor Tds can be turned on based on the second scan signal SC1(n) to supply the data voltage Vdata to the first node N1.

According to one example, the data supply transistor Tds can include an oxide based semiconductor layer. The data supply transistor Tds can have a coplanar structure in which a gate electrode is arranged above the oxide based semiconductor layer. As the data supply transistor Tds is implemented in a coplanar structure, excellent off current characteristic can be obtained and low frequency driving can be performed, whereby power consumption can be reduced. Therefore, as the display apparatus according to embodiments of the present disclosure includes a data supply transistor Tds having excellent off current characteristic, it is possible to prevent off current from flowing between the data line DL and the first node N1 and stably maintain the voltage of the first node N1.

According to one example, the data supply transistor Tds can correspond to a different type of transistor than the light emitting control transistor Tec. For example, the data supply transistor Tds can correspond to an n-type transistor, and the light emitting control transistor Tec can correspond to a p-type transistor. The data supply transistor Tds can output a current entering the drain electrode based on the voltage applied to the gate electrode through the source electrode. In this situation, although the drain electrode and the source electrode of the data supply transistor Tds can be changed depending on a direction of the current, the drain electrode and the source electrode of the data supply transistor Tds are determined based on a direction of the data voltage Vdata, which is supplied to the first node N1, in accordance with a driving method of the pixels P.

The initialization transistor Ti can be turned on based on a first scan signal SC1(n−3) to electrically connect a third voltage supply line VL3 with the third node N3. In detail, the drain electrode of the initialization transistor Ti can be connected with the third voltage supply line VL3, the source electrode of the initialization transistor Ti can be connected with the third node N3, and the gate electrode of the initialization transistor Ti can be connected with the first scan line SL1.

The drain electrode of the initialization transistor Ti can be supplied with an initialization voltage Vinit from the third voltage supply line VL3. The source electrode of the initialization transistor Ti can be connected with the source electrode of the driving transistor Tdr, one end of the storage capacitor Cst, one end of the driving voltage capacitor Cvdd and the anode electrode of the light emitting diode LED through the third node N3. The gate electrode of the initialization transistor Ti can receive the first scan signal SC1(n−3) from the first scan line SL1. Therefore, the initialization transistor Ti can be turned on based on the first scan signal SC1(n−3) to supply the initialization voltage Vinit to the third node N3.

According to one example, the initialization transistor Ti can include an oxide based semiconductor layer. The initialization transistor Ti can have a coplanar structure in which a gate electrode is arranged above the oxide based semiconductor layer. As the initialization transistor Ti is implemented in a coplanar structure, excellent off current characteristic can be obtained and low frequency driving can be performed, whereby power consumption can be reduced. Therefore, as the display apparatus according to embodiments of the present disclosure includes an initialization transistor Ti having excellent off current characteristic, it is possible to prevent off current from flowing between the third voltage supply line VL3 and the third node N3 and stably maintain the voltage of the third node N3.

According to one example, the initialization transistor Ti can correspond to a different type of transistor than the light emitting control transistor Tec. For example, the initialization transistor Ti can correspond to an n-type transistor, and the light emitting control transistor Tec can correspond to a p-type transistor. The initialization transistor Ti can output a current entering the drain electrode based on the voltage applied to the gate electrode through the source electrode. In this situation, although the drain electrode and the source electrode of the initialization transistor Ti can be changed depending on a direction of the current, the drain electrode and the source electrode of the initialization transistor Ti are determined based on a direction of the initialization voltage Vinit, which is supplied to the third node N3, in accordance with a driving method of the pixels P.

The light emitting control transistor Tec can be turned on based on an emission signal EM to electrically connect a second voltage supply line VL2 with the second node N2. In detail, the source electrode of the light emitting control transistor Tec can be connected with the second voltage supply line VL2, the drain electrode of the light emitting control transistor Tec can be connected with the second node N2, and the gate electrode of the light emitting control transistor Tec can be connected with an emission control line EML.

The source electrode of the light emitting control transistor Tec can be supplied with a driving voltage VDD from the second voltage supply line VL2, and can be connected with the other end opposite to one end of the driving voltage capacitor Cvdd connected to the third node N3. The drain electrode of the light emitting control transistor Tec can be connected with the drain electrode of the driving transistor Tdr through the second node N2. The gate electrode of the light emitting control transistor Tec can receive the emission signal EM from the emission control line EML. Therefore, the light emitting control transistor Tec can be turned on based on the emission signal EM to supply the driving voltage VDD to the second node N2.

According to one example, the light emitting control transistor Tec can include a silicon based semiconductor layer. In detail, the light emitting control transistor Tec can include a semiconductor layer made of low temperature polycrystalline silicon (LTPS). As the light emitting control transistor Tec includes a semiconductor layer made of low temperature polycrystalline silicon, high electron mobility and excellent turn-on characteristic can be obtained. Therefore, as the display apparatus according to embodiments of the present disclosure includes a light emitting control transistor Tec having excellent turn-on characteristic, it is possible to drive the pixel circuit stably and efficiently.

For example, the light emitting control transistor Tec can correspond to a p-type transistor, and can output the current entering the source electrode based on the voltage applied to the gate electrode through the drain electrode.

The storage capacitor Cst can be connected between the first node N1 and the third node N3. In detail, the storage capacitor Cst can store a differential voltage between the first node N1 and the third node N3 to control the voltage of the first node N1. For example, even though the initialization transistor Ti is turned off, the voltage of the third node N3 can uniformly be maintained by a potential difference between both ends of the driving voltage capacitor Cvdd and the voltage of the first node N1 can uniformly be maintained by a potential difference between the other end of the storage capacitor Cst and the other end of the driving voltage capacitor Cvdd. As a result, since the storage capacitor Cst uniformly maintains the voltage of the first node N1 even though the initialization transistor Ti is turned off, the storage capacitor Cst can control the operation of the driving transistor Tdr.

The driving voltage capacitor Cvdd can be connected between the second voltage supply line VL2 and the third node N3. In detail, the driving voltage capacitor Cvdd can store a differential voltage between the second voltage supply line VL2 and the third node N3 to control the voltage of the third node N3. For example, even though the initialization transistor Ti is turned off, the voltage of the third node N3 can uniformly be maintained by a potential difference between both ends of the driving voltage capacitor Cvdd. As a result, the driving voltage capacitor Cvdd uniformly maintains the voltage of the third node N3 even though the initialization transistor Ti is turned off.

For example, if the pixel circuit for driving the light emitting diode includes only a plurality of transistors having an excellent subthreshold swing factor (S-factor), includes only a plurality of transistors having excellent off current characteristic or includes only a plurality of transistors having excellent turn-on characteristic, a limit value of the subthreshold swing factor (S-factor) exists to consider all of the subthreshold swing factor (S-factor), the off current characteristic, and the turn-on characteristic.

Consequently, as the display apparatus according to embodiments of the present disclosure includes the driving transistor Tdr having excellent subthreshold swing factor (S-factor), the reference supply transistor Trs, the data supply transistor Tds and the initialization transistor Ti, each of which has excellent off current characteristic, and the light emitting control transistor Tec having excellent turn-on characteristic, it is possible to satisfy the excellent off current and turn-on characteristics and at the same time maximize the subthreshold swing factor (S-factor) of the driving transistor Tdr to subdivide gradation.

The light emitting diode LED can emit light by receiving the driving current Iled from the pixel circuit. In detail, the anode electrode of the light emitting diode LED can be connected with the driving transistor Tdr in series.

According to one example, the light emitting diode LED can include an anode electrode connected to the third node N3, a light emitting layer formed on the anode electrode, and a cathode electrode connected to the light emitting layer.

The anode electrode can be arranged on an opening portion of the pixel P, and can electrically be connected with the third node N3.

The light emitting layer can be arranged on the anode electrode. For example, the light emitting layer can have a structure of a hole transporting layer/a light emitting layer/an electron transporting layer, or a structure of a hole injection layer/hole transporting layer/a light emitting layer/an electron transporting layer/an electron injection layer. The light emitting layer can further include a function layer for improving emission efficiency and lifespan of the light emitting layer.

The cathode electrode can be formed along a length direction of the scan line SL or the data line DL, or can commonly be connected to all of the pixels P. According to one example, the cathode electrode can receive a common power source Vss from the data driving circuit 500 or a power supply circuit. In this way, the light emitting diode LED can emit light based on the driving current Iled flowing in accordance with driving of the driving transistor Tdr.

Figure 5:
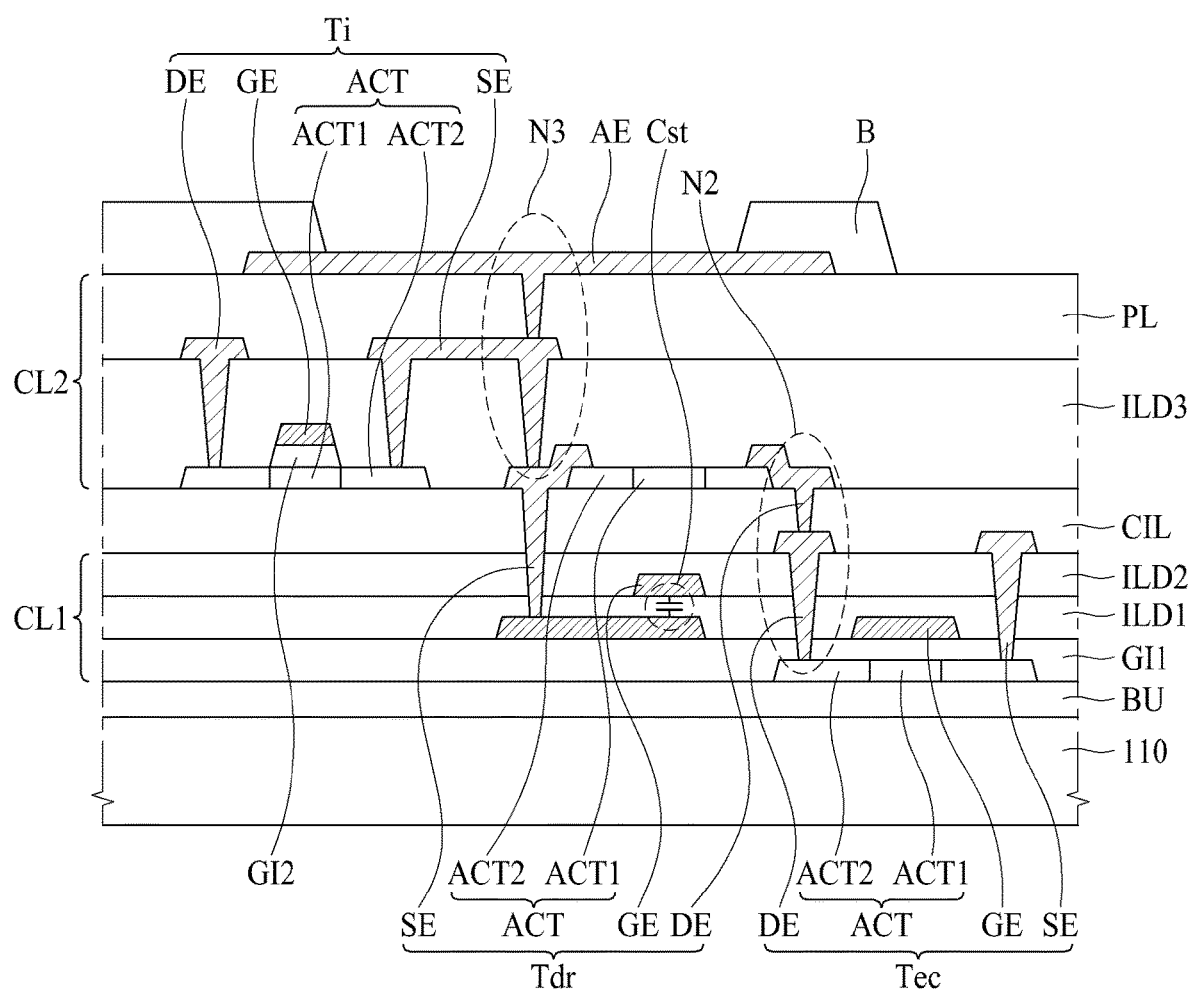
FIG. 5 is a layout cross-sectional view illustrating a deposition relation of a driving transistor, an initialization transistor and a light emitting control transistor in a pixel circuit shown in FIG. 4 according to an embodiment of the present disclosure.

FIG. 5 is a layout cross-sectional view illustrating a deposition relation of a driving transistor, an initialization transistor and a light emitting control transistor in a pixel circuit shown in FIG. 4.

Referring to FIGS. 4 and 5, the display apparatus can include a substrate 110, a buffer layer BU, a first circuit layer CL1, a circuit insulating layer CIL, a second circuit layer CL2, an anode electrode AE of an light emitting diode LED, and a bank B.

The substrate 110 is a base substrate, and can be a transparent flexible substrate that can be curved or bent. According to one example, the substrate 110 can include, but is not limited to, a polyimide material. The substrate 110 can be made of a transparent plastic material, such as polyethylene terephthalate. According to another example, the substrate 110 can be a glass substrate.

The buffer layer BU can be arranged on the substrate 110. According to one example, the buffer layer BU can be formed in such a manner that a plurality of inorganic films are deposited. The buffer layer BU can be formed on the entire upper surface of the substrate 110 to prevent water from being permeated into the light emitting diode through the substrate 110.

The first circuit layer CL1 can include a first gate insulating film GI1, first and second inter-layer dielectric ILD1 and ILD2, and a light emitting control transistor Tec. The first circuit layer CL1 can include a transistor of a first type. For example, the transistor of the first type can include a semiconductor layer ACT made of low temperature polycrystalline silicon (LTPS).

The light emitting control transistor Tec can include a silicon based semiconductor layer ACT. In detail, the light emitting control transistor Tec can include a semiconductor layer ACT made of low temperature polycrystalline silicon (LTPS). As the light emitting control transistor Tec includes a semiconductor layer made of low temperature polycrystalline silicon (LTPS), high electron mobility and excellent turn-on characteristic can be obtained.

The semiconductor layer ACT of the light emitting control transistor Tec can be arranged on the buffer layer BU, and can be overlapped with the gate electrode GE, the source electrode SE, and the drain electrode DE. The semiconductor layer ACT can directly be in contact with the source electrode SE and the drain electrode DE, and can face the gate electrode GE by interposing the first gate insulating film GI1 therebetween.

According to one example, the semiconductor layer ACT can include a channel area ACT1 and source/drain areas ACT2. The channel area ACT1 can be formed on a center area of the semiconductor layer ACT, and the source/drain areas ACT2 can be formed in parallel with each other by interposing the channel area ACT1 therebetween. The channel area ACT1 can be overlapped with the gate electrode GE, and the source/drain areas ACT2 can be overlapped with the source electrode SE and the drain electrode DE.

The first gate insulating film GI1 can be provided on the semiconductor layer ACT of the light emitting control transistor Tec. The first gate insulating film GI1 can be provided on the buffer layer BU. In detail, the first gate insulating film GI1 can insulate the semiconductor layer ACT from the gate electrode GE.

The light emitting control transistor Tec can further include a gate electrode GE, a source electrode SE, and a drain electrode DE.

The gate electrode GE of the light emitting control transistor Tec can be provided on the first gate insulating film GI1. The gate electrode GE can be overlapped with the channel area ACT1 of the semiconductor layer ACT by interposing the first gate insulating film GI1 therebetween.

The first and second inter-layer dielectric films ILD1 and ILD2 can sequentially be deposited on the gate electrode GE. The first and second inter-layer dielectric films ILD1 and ILD2 can be provided on the first gate insulating film GI1 to protect the light emitting control transistor Tec. A corresponding area of the first and second inter-layer dielectric films ILD1 and ILD2 can be removed to allow the active layer ACT to be in contact with the source electrode SE or the drain electrode DE. For example, the first and second inter-layer dielectric films ILD1 and ILD2 can include a contact hole through which the source electrode SE passes, and a contact hole through which the drain electrode DE passes.

The source electrode SE and the drain electrode DE of the light emitting control transistor Tec can be provided to be spaced apart from each other on the second inter-layer dielectric film ILD2. The drain electrode DE can be in contact with one end of the source/drain areas ACT2 of the active layer ACT through the contact hole provided in the first gate insulating film GI1 and the first and second inter-layer dielectric films ILD1 and ILD2, and the source electrode SE can be in contact with the other end of the source/drain areas ACT2 of the active layer ACT through the contact hole provided in the first gate insulating film GI1 and the first and second inter-layer dielectric films ILD1 and ILD2.

The drain electrode DE of the light emitting control transistor Tec can directly be in contact with the drain electrode DE of the driving transistor Tdr, which passes through a contact hole provided in the circuit insulating layer CIL. As shown in FIG. 4, the drain electrode DE of the light emitting control transistor Tec can electrically be connected to the second node N2.

The first circuit layer CL1 can further include the gate electrode GE of the driving transistor Tdr. In detail, the gate electrode GE of the driving transistor Tdr can be arranged on the first inter-layer dielectric film ILD1 and covered by the second inter-layer dielectric film ILD2. That is, the gate electrode GE of the driving transistor Tdr can be insulated from the active layer ACT of the driving transistor Tdr by the second inter-layer dielectric film ILD2 and the circuit insulating layer CIL.

The first circuit layer CL1 can further include a storage capacitor Cst that includes a first capacitor electrode GE and a second capacitor electrode. In detail, the first capacitor electrode GE can be made of the gate electrode GE of the driving transistor Tdr, and the second capacitor electrode can be arranged on the first gate insulating film GI1 to overlap the first capacitor electrode GE. The second capacitor electrode of the storage capacitor Cst can electrically be connected with the source electrode SE of the driving transistor Tdr. That is, the storage capacitor Cst can storage a differential voltage between the gate electrode GE and the source electrode SE of the driving transistor Tdr.

In this way, the display apparatus according to embodiments of the present disclosure uses the gate electrode GE of the driving transistor Tdr arranged on the first circuit layer CL1 as the first capacitor electrode of the storage capacitor Cst, whereby the number of contact holes for electrically connecting the first and second capacitor electrodes of the storage capacitor Cst can be minimized.

In other words, as the display apparatus according to embodiments of the present disclosure includes a driving transistor Tdr having a back channel etch structure (BCE), it is possible to minimize the number of contact holes for electrically connecting the storage capacitor Cst formed between the gate electrode GE and the source electrode SE of the driving transistor Tdr as compared with the coplanar structure in which the driving transistor includes an oxide based semiconductor layer or includes a semiconductor layer made of low temperature polycrystalline silicon (LTPS).

As the gate electrode GE of the driving transistor Tdr is arranged on the first circuit layer CL1 and the active layer ACT of the driving transistor Tdr is arranged on the second circuit layer CL2 on the first circuit layer CL1, the driving transistor Tdr can have a back channel etch (BCE) structure. Therefore, as the display apparatus according to embodiments of the present disclosure includes a driving transistor Tdr having a back channel etch structure (BCE), it is possible to implement an image of high resolution by improving a subthreshold swing factor (S-factor) of the pixel circuit and subdividing gradation.

The circuit insulating layer CIL can be arranged on the first circuit layer CL1 to insulate the first circuit layer CL1 and the second circuit layer CL2 from each other. For example, the circuit insulating layer CIL can be made of an organic insulating material and an inorganic insulating material.

According to one example, the circuit insulating layer CIL can be formed at a relatively thick thickness to planarize the upper surface of the first circuit layer CIL. According to another example, the circuit insulating layer CIL can be formed at a relatively thin thickness to have a shape that follows a surface shape and contours of the first circuit layer CIL as it is.

The second circuit layer CL2 can include a second gate insulating GI2, a third inter-layer dielectric film ILD3, a planarization layer PL, and an initialization transistor Ti. The second circuit layer CL2 can include a transistor of a second type. For example, the transistor of the second type can have a coplanar structure in which a gate electrode GE is arranged above the oxide based semiconductor layer ACT.

The initialization transistor Ti can include an oxide based semiconductor layer ACT. The initialization transistor Ti can have a coplanar structure in which a gate electrode GE is arranged above the oxide based semiconductor layer ACT. As the initialization transistor Ti is implemented in a coplanar structure, excellent off current characteristic can be obtained and low frequency driving can be performed, whereby power consumption can be reduced.

The semiconductor layer ACT of the initialization transistor Ti can be arranged on the circuit insulating layer CIL, and can be overlapped with the gate electrode GE, the source electrode SE, and the drain electrode DE. The semiconductor layer ACT can directly be in contact with the source electrode SE and the drain electrode DE, and can face the gate electrode GE by interposing the second gate insulating film GI2 therebetween.

According to one example, the semiconductor layer ACT of the initialization transistor Ti can include a channel area ACT1 and source/drain areas ACT2. The channel area ACT1 can be formed on a center area of the semiconductor layer ACT, and the source/drain areas ACT2 can be formed in parallel with each other by interposing the channel area ACT1 therebetween. The channel area ACT1 can be overlapped with the gate electrode GE, and the source/drain areas ACT2 can be overlapped with the source electrode SE and the drain electrode DE.

The second gate insulating film GI2 can be provided on the semiconductor layer ACT of the initialization transistor Ti. In detail, the second gate insulating film GI2 can insulate the semiconductor layer ACT from the gate electrode GE.

The initialization transistor Ti can further include a gate electrode GE, a source electrode SE, and a drain electrode DE.

The gate electrode GE of the initialization transistor Ti can be provided on the second gate insulating film GI2. The gate electrode GE can be overlapped with the channel area ACT1 of the semiconductor layer ACT by interposing the second gate insulating film GI2 therebetween.

The drain electrode DE and the source electrode SE of the initialization transistor Ti can be provided to be spaced apart from each other on the third inter-layer dielectric film ILD3. The drain electrode DE can be in contact with one end of the source/drain areas ACT2 of the active layer ACT through the contact hole provided in the third inter-layer dielectric film ILD3, and one end of the source electrode SE can be in contact with the other end of the source/drain areas ACT2 of the active layer ACT through the contact hole provided in the third inter-layer dielectric film ILD3.

The other end of the source electrode SE of the initialization transistor Ti can directly be in contact with the source electrode SE of the driving transistor Tdr through the contact hole provided in the third inter-layer dielectric film ILD3. The other end of the source electrode SE of the initialization transistor Ti can directly be in contact with the anode electrode AE that passes through the contact hole provided in the planarization layer PL. As shown in FIG. 4, the source electrode SE of the initialization transistor Ti, the source electrode SE of the driving transistor Tdr and the anode electrode AE of the light emitting diode LED can electrically be connected to the third node N3.

The third inter-layer dielectric film ILD3 can cover the semiconductor layer ACT and the gate electrode GE of the initialization transistor Ti. That is, the third inter-layer dielectric film ILD3 can be arranged on the initialization transistor Ti to protect the initialization transistor Ti.

According to one example, each of the reference supply transistor Trs and the data supply transistor Tds can further include a semiconductor layer arranged on the same layer as the semiconductor layer ACT of the initialization transistor Ti and formed of the same material as that of the semiconductor layer ACT of the initialization transistor Ti.

Each of the reference supply transistor Trs and the data supply transistor Tds can further include a gate electrode, a source electrode, and a drain electrode, which are arranged on the same layer as the gate electrode GE, the source electrode SE and the drain electrode DE of the initialization transistor Ti and formed of the same material as that of the gate electrode GE, the source electrode SE and the drain electrode DE of the initialization transistor Ti.

As described above, as the reference supply transistor Trs, the data supply transistor Tds and the initialization transistor Ti are arranged on the second circuit layer CL2 and implemented in the coplanar structure that includes an oxide based semiconductor layer ACT, excellent off current characteristic can be obtained and low frequency driving can be performed, whereby power consumption can be reduced. Therefore, as the display apparatus according to embodiments of the present disclosure includes a reference supply transistor Trs, a data supply transistor Tds and an initialization transistor Ti, each of which has excellent off current characteristic, it is possible to prevent off current from flowing between the third node N3 and the third voltage supply line VL3 and stably maintain the gate-source voltage of the driving transistor Tdr.

The planarization layer PL can be arranged on the substrate 110, and can cover all of the transistors arranged on the display area AA. In detail, the planarization layer PL can be provided on the third inter-layer dielectric film ILD3 to planarize the upper end of the pixel circuit. For example, the planarization layer PL can include a contact hole through which the anode electrode AE passes.

The second circuit layer CL2 can further include the semiconductor layer ACT, the source electrode SE and the drain electrode DE of the driving transistor Tdr. In detail, the semiconductor layer ACT of the driving transistor Tdr can be arranged on the circuit insulating layer CIL, and can be overlapped with the gate electrode GE, the source electrode SE and the drain electrode DE. The semiconductor layer ACT can directly be in contact with the source electrode SE and the drain electrode DE, and can face the gate electrode GE by interposing the second inter-layer dielectric film ILD2 and the circuit insulating layer CIL therebetween.

According to one example, the semiconductor layer ACT of the driving transistor Tdr can include a channel area ACT1 and source/drain areas ACT2. The channel area ACT1 can be formed on a center area of the semiconductor layer ACT, and the source/drain areas ACT2 can be formed in parallel with each other by interposing the channel area ACT1 therebetween. The channel area ACT1 can be overlapped with the gate electrode GE, and the source/drain areas ACT2 can be overlapped with the source electrode SE and the drain electrode DE.

The source electrode SE of the driving transistor Tdr can be provided on the circuit insulating layer CIL while covering one end of the source/drain areas ACT2 of the semiconductor layer ACT. The drain electrode DE of the driving transistor Tdr can be provided on the circuit insulating layer CIL while covering the other end of the source/drain areas ACT2 of the semiconductor layer ACT. Each of the source electrode SE and the drain electrode DE of the driving transistor Tdr can be spaced apart from the channel area ACT1 of the semiconductor layer ACT.

The source electrode SE of the driving transistor Tdr can directly be in contact with the other end of the initialization transistor Ti that passes through the contact hole provided in the third inter-layer dielectric film ILD3. As shown in FIG. 4, the source electrode SE of the initialization transistor Ti, the source electrode SE of the driving transistor Tdr and the anode electrode AE of the light emitting diode LED can electrically be connected to the third node N1.

The semiconductor layer ACT, the source electrode SE and the drain electrode DE of the driving transistor Tdr can be insulated from the gate electrode GE arranged on the first circuit layer CL1 by the second inter-layer dielectric film ILD2 and the circuit insulating layer CIL. In this way, as the gate electrode GE of the driving transistor Tdr is arranged on the first circuit layer CL1 and the active layer ACT of the driving transistor Tdr is arranged on the second circuit layer CL2 on the first circuit layer CL1, the driving transistor Tdr can have a back channel etch (BCE) structure. Therefore, as the display apparatus according to embodiments of the present disclosure includes a driving transistor Tdr having a back channel etch structure (BCE), it is possible to implement an image of high resolution by improving a subthreshold swing factor (S-factor) of the pixel circuit and subdividing gradation.

For example, if the pixel circuit for driving the light emitting diode includes only a plurality of transistors having an excellent subthreshold swing factor (S-factor), or includes only a plurality of transistors having excellent off current characteristic or includes only a plurality of transistors having excellent turn-on characteristic, a limit value of the subthreshold swing factor (S-factor) exists to consider all of the subthreshold swing factor (S-factor), the off current characteristic, and the turn-on characteristic.

Consequently, as the display apparatus according to embodiments of the present disclosure includes the driving transistor Tdr having excellent subthreshold swing factor (S-factor), the reference supply transistor Trs, the data supply transistor Tds and the initialization transistor Ti, each of which has excellent off current characteristic, and the light emitting control transistor Tec having excellent turn-on characteristic, it is possible to satisfy the excellent off current and turn-on characteristics and at the same time maximize the subthreshold swing factor (S-factor) of the driving transistor Tdr to subdivide gradation.

The anode electrode AE of the light emitting diode LED can be arranged in an opening portion of each of the plurality of pixels on the planarization layer PL. In detail, the anode electrode AE can be surrounded by a bank B that defines the opening portion of each of the plurality of pixels.

Figure 6:
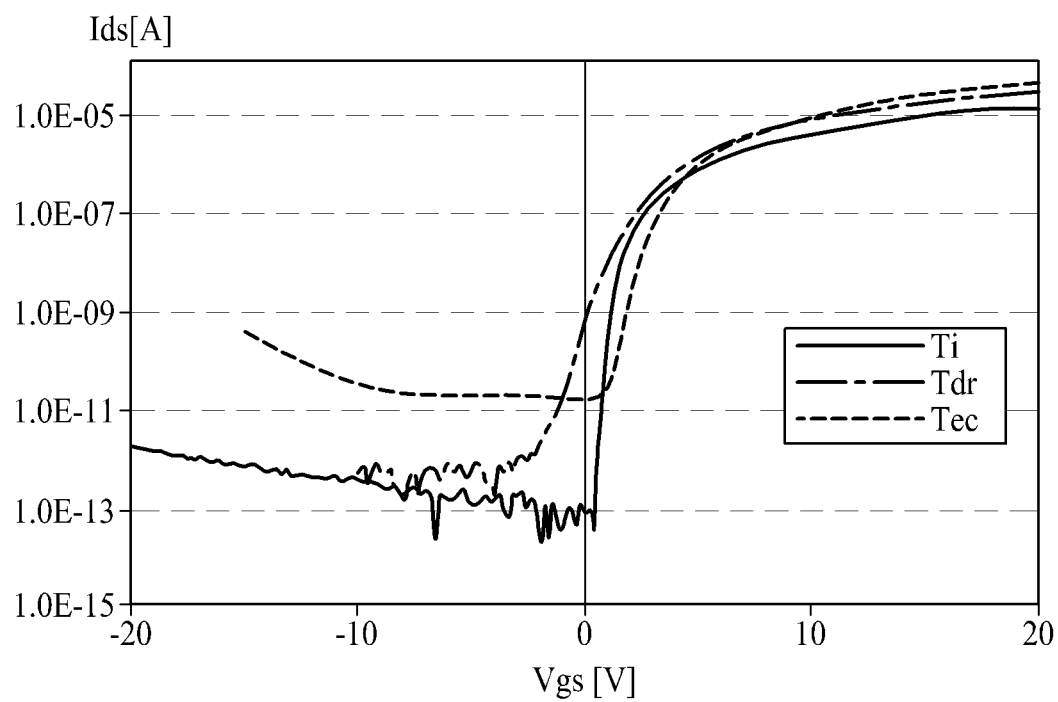
FIG. 6 is a graph illustrating a drain-source current curve according to a gate-source voltage of each of a driving transistor, an initialization transistor and a light emitting control transistor in a pixel circuit shown in FIG. 4 according to an embodiment of the present disclosure.

FIG. 6 is a graph illustrating a drain-source current curve according to a gate-source voltage of each of a driving transistor, an initialization transistor and a light emitting control transistor in a pixel circuit shown in FIG. 4, and FIG. 7 is a view illustrating a gradation region and a subthreshold area of each of a driving transistor, an initialization transistor and a light emitting control transistor in a pixel circuit shown in FIG. 4. In this situation, numerical values of the gate-source voltage Vgs and the drain-source current Ids shown in FIG. 7 are obtained by quantifying the graph shown in FIG. 6.

Referring to FIGS. 6 and 7, the driving transistor Tdr can have a back channel etch (BCE) structure, the initialization transistor Ti can have a coplanar structure, and the light emitting control transistor Tec can have a low temperature polycrystalline silicon (LTPS) structure.

In FIG. 6, a gradient of a drain-source current (Ids) curve according to the gate-source voltage Vgs means a subthreshold swing factor (S-factor). That is, it is noted that the subthreshold swing factor (S-factor) of the driving transistor Tdr is more excellent than that of each of the initialization transistor Ti and the light emitting control transistor Tec. In other words, better subthreshold swing factor (S-factor) can be provided by the driving transistor Tdr, since the slope of its corresponding of a drain-source current (Ids) curve is less steep than the other types of transistors, which allows for better gradation subdivision in order to provide a better picture with better colors.

In FIG. 7, a gradation region means a certain section of the gate-source voltage Vgs, in which the gradient of the drain-source current (Ids) curve according to the gate-source voltage Vgs of the transistor corresponds to a specific range. For example, the gradation region of the driving transistor Tdr having a back channel etch (BCE) structure corresponds to a region where the gate-source voltage Vgs is 0.8 V to 2 V. The gradation region of the initialization transistor Ti having a coplanar structure corresponds to a region where the gate-source voltage Vgs is 0.6 V to 1.4 V. Also, the gradation region of the light emitting control transistor Tec having a low temperature polycrystalline silicon (LTPS) structure corresponds to a region where the gate-source voltage Vgs is 0.8 V to 2 V.

Therefore, it is noted that the gradation region of the driving transistor Tdr is wider than that of each of the initialization transistor Ti and the light emitting control transistor Tec.

In addition, the initialization transistor Ti having a coplanar structure has advantages in that it has more excellent off current characteristic than the driving transistor Tdr and the initialization transistor Ti and is capable of performing low frequency driving while the light emitting control transistor that includes a semiconductor transistor made of low temperature polycrystalline silicon (LTPS) has excellent turn-on characteristic.

For example, if the pixel circuit for driving the light emitting diode includes only a plurality of transistors having an excellent subthreshold swing factor (S-factor), or includes only a plurality of transistors having excellent off current characteristic or includes only a plurality of transistors having excellent turn-on characteristic, a limit value of the subthreshold swing factor (S-factor) exists to consider all of the subthreshold swing factor (S-factor), the off current characteristic, and the turn-on characteristic.

Consequently, as the display apparatus according to embodiments of the present disclosure includes the driving transistor Tdr having excellent subthreshold swing factor (S-factor), the reference supply transistor Trs, the data supply transistor Tds and the initialization transistor Ti, each of which has excellent off current characteristic, and the light emitting control transistor Tec having excellent turn-on characteristic, it is possible to satisfy the excellent off current and turn-on characteristics while at the same time maximize the subthreshold swing factor (S-factor) of the driving transistor Tdr to subdivide gradation.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. A display apparatus comprising:
a plurality of pixels; and
a pixel circuit in each of the plurality of pixels, the pixel circuit including:
a driving transistor,
a light emitting diode electrically connected to the driving transistor,
a first circuit layer including:
a first semiconductor layer of a first material disposed on a substrate, and
at least one first type of transistor having a first gate electrode disposed on the first semiconductor layer of the first material, a circuit insulating layer disposed on the first circuit layer, and
a second circuit layer including:
  a second semiconductor layer of a second material disposed on the circuit insulating layer, the second material being a different type of material than the first material, and
  at least one second type of transistor having a second gate electrode disposed on the second semiconductor layer of the second material,
wherein the driving transistor includes:
  a gate electrode disposed on the first circuit layer, and
  a semiconductor layer of the second material and disposed on a same layer as the second semiconductor layer of the at least one second type of transistor, the semiconductor layer of the driving transistor being spaced apart from the second semiconductor layer of the at least one second type of transistor, and
wherein the gate electrode of the driving transistor and the semiconductor layer of the driving transistor are disposed on opposite sides of the circuit insulating layer.

2. The display apparatus according to claim 1, wherein the at least one second type of transistor includes:
a sampling transistor for selectively connecting a first node with a second node,
wherein the first node is connected to a source electrode of the driving transistor, and the second node is connected to the gate electrode of the driving transistor.

3. The display apparatus according to claim 1, wherein the at least one first type of transistor includes:
a first light emitting control transistor for selectively connecting a first node with an anode electrode of the light emitting diode, the first node being a source electrode of the driving transistor;
a first initialization transistor for supplying an initialization voltage supplied from a first voltage supply line to the first node;
a second light emitting control transistor for supplying a driving voltage supplied from a second voltage supply line to a third node, the third node being a drain electrode of the driving transistor;
a second initialization transistor for supplying the initialization voltage to the anode electrode of the light emitting diode; and
a data supply transistor for supplying a data voltage to the third node.

4. The display apparatus according to claim 1, wherein the first semiconductor layer of the first material is made of low temperature polycrystalline silicon (LTPS), and
wherein the second semiconductor layer of the second material is made of an oxide semiconductor.

5. The display apparatus according to claim 3, wherein the pixel circuit further includes:
a storage capacitor having a first capacitor electrode made of the gate electrode of the driving transistor, and
a second capacitor electrode overlapped with the first capacitor electrode, the second capacitor electrode being electrically connected with a source electrode of the second light emitting control transistor and configured to receive the driving voltage from the second voltage supply line.

6. The display apparatus according to claim 3, wherein the anode electrode of the light emitting diode is disposed on a planarization layer covering the second circuit layer, and
wherein the anode electrode of the light emitting diode is electrically connected with a drain electrode of the first light emitting control transistor on the first circuit layer.

7. The display apparatus according to claim 1, wherein the at least one first type of transistor includes:
a light emitting control transistor for supplying a driving voltage supplied from a second voltage supply line to a second node, the second node being a drain electrode of the driving transistor.

8. The display apparatus according to claim 7, wherein the pixel circuit further includes:
a driving voltage capacitor including:
  a first capacitor electrode electrically connected with a source electrode of the light emitting control transistor, the first capacitor electrode being configured to receive the driving voltage from the second voltage supply line, and
  a second capacitor electrode electrically connected with a source electrode of the driving transistor.

9. The display apparatus according to claim 1, wherein the circuit insulating layer is disposed between the first circuit layer and the second circuit layer.

10. The display apparatus according to claim 1, wherein the at least one first type of transistor is a p-type of transistor, and
wherein the at least one second type of transistor is an n-type of transistor.

11. The display apparatus according to claim 1, wherein the driving transistor has a back channel etch structure (BCE), and
wherein the semiconductor layer of the driving transistor is made of an oxide semiconductor.

12. The display apparatus according to claim 1, wherein an anode electrode of the light emitting diode overlaps with one of the at least one first type of transistor, one of the at least one second type of transistor and the driving transistor.

13. A display apparatus comprising:
a plurality of pixels; and
a pixel circuit in each of the plurality of pixels, the pixel circuit including:
  a driving transistor,
  a light emitting diode electrically connected to the driving transistor,
  a first circuit layer including:
    a first semiconductor layer of a first material disposed on a substrate, and
    a first transistor of a first type having a first gate electrode arranged on the semiconductor layer of the first material,
  a circuit insulating layer disposed on the first circuit layer,
  a second circuit layer including:
    a second semiconductor layer of a second material disposed on the circuit insulating layer, the second material being a different type of material than the first material, and
    a second transistor of a second type having a second gate electrode disposed on the second semiconductor layer of the second material,
  a driving transistor including:
    a gate electrode disposed on the first circuit layer, and
    a semiconductor layer disposed on a same layer as the second semiconductor layer of the second transistor of the second type,
  a storage capacitor formed between the gate electrode of the driving transistor and a source electrode of the driving transistor, and wherein the gate electrode of the driving transistor and the semiconductor layer of the driving transistor are disposed on opposite sides of the circuit insulating layer.

14. The display apparatus according to claim 13, wherein the second transistor of the second type includes a plurality of transistors including:
   a reference supply transistor for supplying a reference voltage form a first voltage supply line to a first node, the first node being the gate electrode of the driving transistor;
   a data supply transistor for supplying a data voltage to the first node; and
an initialization transistor for supplying an initialization voltage to an anode electrode of the light emitting diode.

15. The display apparatus according to claim 13, wherein the first semiconductor layer of the first material is made of low temperature polycrystalline silicon (LTPS), and
   wherein the second semiconductor layer and the semiconductor layer of the driving transistor are both made of the second material, the second material including an oxide semiconductor.

16. The display apparatus according to claim 13, wherein an anode electrode of the light emitting diode is disposed on a planarization layer covering the second circuit layer, and
   wherein the anode electrode of the light emitting diode is electrically connected with the source electrode of the driving transistor on the second circuit layer.

17. The display apparatus according to claim 13, wherein the storage capacitor includes:
   a first capacitor electrode made of the gate electrode of the driving transistor, and
   a second capacitor electrode overlapped with the first capacitor electrode, the second capacitor electrode being electrically connected with the source electrode of the driving transistor.

18. A display apparatus comprising:
   a first transistor disposed on a substrate, the first transistor including a first active layer made of low temperature polycrystalline silicon (LTPS);
   a circuit insulating layer disposed on the first transistor;
   a second transistor disposed on the circuit insulating layer, the second transistor including a second active layer made of an oxide semiconductor;
   a driving transistor disposed on the circuit insulating layer, the driving transistor including a back channel etch structure (BCE) and an active layer made of the oxide semiconductor; and
   a light emitting diode electrically connected to the driving transistor,
   wherein the circuit insulating layer is disposed between the first transistor and the driving and second transistors, and
   wherein a gate electrode of the driving transistor and the active layer of the driving transistor are disposed on opposite sides of the circuit insulating layer.

19. The display apparatus according to claim 18, wherein an anode electrode of the light emitting diode overlaps with the first transistor, the second transistor and the driving transistor.

* * * * *